(12) United States Patent
Sato et al.

(10) Patent No.: US 12,247,298 B2
(45) Date of Patent: Mar. 11, 2025

(54) SEMICONDUCTOR WAFER TREATMENT LIQUID AND PRODUCTION METHOD THEREOF

(71) Applicant: TOKUYAMA CORPORATION, Yamaguchi (JP)

(72) Inventors: Tomoaki Sato, Yamaguchi (JP); Yuki Kikkawa, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 17/642,059

(22) PCT Filed: Nov. 25, 2021

(86) PCT No.: PCT/JP2021/043087
§ 371 (c)(1),
(2) Date: Mar. 10, 2022

(87) PCT Pub. No.: WO2022/114036
PCT Pub. Date: Jun. 2, 2022

(65) Prior Publication Data
US 2022/0411937 A1 Dec. 29, 2022

(30) Foreign Application Priority Data
Nov. 26, 2020 (JP) .................. 2020-196348

(51) Int. Cl.
*C23F 1/40* (2006.01)
*H01L 21/3213* (2006.01)

(52) U.S. Cl.
CPC .......... *C23F 1/40* (2013.01); *H01L 21/32134* (2013.01)

(58) Field of Classification Search
CPC ......... C23F 1/40; C23F 1/38; H01L 21/32134
USPC ....................................... 216/16
See application file for complete search history.

(56) References Cited

U.S. PATENT DOCUMENTS

| | | | |
|---|---|---|---|
| 2001/0023701 A1 | 9/2001 | Aoki et al. | |
| 2002/0060202 A1* | 5/2002 | Fukunaga | H01L 21/6708 257/E21.309 |
| 2003/0139050 A1 | 7/2003 | Thomas et al. | |
| 2005/0176603 A1* | 8/2005 | Hsu | G03F 7/426 134/42 |
| 2012/0256122 A1 | 10/2012 | Sato et al. | |
| 2021/0062115 A1 | 3/2021 | Shimoda et al. | |
| 2021/0189235 A1 | 6/2021 | Sugimura et al. | |
| 2022/0073820 A1 | 3/2022 | Kikkawa et al. | |

FOREIGN PATENT DOCUMENTS

| | | |
|---|---|---|
| JP | 2001-234373 | 8/2001 |
| JP | 2002-161381 | 6/2002 |
| JP | 2005-516384 | 6/2005 |
| JP | 2005-227749 | 8/2005 |
| JP | 2019-218436 | 12/2019 |
| KR | 10-2016-0039539 A | 4/2016 |
| WO | 2019/142788 | 7/2019 |
| WO | 2020/049955 | 3/2020 |
| WO | 2020/166677 | 8/2020 |

OTHER PUBLICATIONS

Translation of WO2020049955A1 (Year: 2020).*
Translation of WO 2020166677 A1 (Year: 2020).*
International Search Report issued in PCT/JP2021/043087, dated Jan. 25, 2022.
Extended European Search Report issued in EP Patent Application No. 21898008.4, Jan. 7, 2025.

* cited by examiner

*Primary Examiner* — Duy Vu N Deo
(74) *Attorney, Agent, or Firm* — GREENBLUM & BERNSTEIN, P.L.C.

(57) ABSTRACT

The present invention provides a semiconductor wafer treatment liquid, the treatment liquid including at least one hypohalite ion, and at least one anion species selected from halate ion, halite ion and halide ion, wherein at least one of the anion species has a content of 0.30 mol/L or more and 6.00 mol/L or less relative to the treatment liquid.

13 Claims, No Drawings

SEMICONDUCTOR WAFER TREATMENT LIQUID AND PRODUCTION METHOD THEREOF

TECHNICAL FIELD

The present invention relates to a semiconductor wafer treatment liquid. Particularly, it relates to a semiconductor wafer treatment liquid which is sufficient in etching rate of a metal for use in a wiring layer of a semiconductor element and which can inhibit metal surface roughness due to etching.

BACKGROUND ART

Wiring layers in semiconductor elements play a key role in outputting electric signals from transistors outwardly. In recent years, the miniaturization of design rules for semiconductor elements has been in progress, and there has been a tendency for an increase in wiring resistance. As a result of the increased wiring resistance, high-speed operations of semiconductor elements tend to be significantly hindered, and countermeasures therefor have been needed. Therefore, wiring materials in which electromigration resistance is high and the resistance value is reduced as compared with those of conventional wiring materials are needed.

Ruthenium is drawing attention, in particular, as a wiring material for use in a semiconductor element with a design rule of 10 nm or less, in particular, because ruthenium has a higher electromigration resistance, and is capable of reducing the wiring resistance value, as compared to aluminum and copper which are conventional wiring materials. In addition, since ruthenium is capable of preventing the electromigration even in cases where copper is used as a wiring material, the use of ruthenium has been investigated not only as a wiring material, but also as a barrier metal for a copper wiring.

Even in cases where ruthenium is selected as a wiring material in the step of forming the wiring of a semiconductor element, the wiring is formed by dry or wet etching, in the same manner as in the case of using a conventional wiring material. However, in cases where dry etching of ruthenium is performed, problems are that precise etching is difficult due to the occurrence of in-plane unevenness by a plasma distribution and/or due to an increase or decrease in etching rate depending on fluxes or energies of reactive species and ion, and that etching is inhibited due to tight attachment of $RuO_2$ as a reaction product to a pattern wall surface. Therefore, wet etching is drawing attention, as a method which is capable of more precisely etching ruthenium.

While multilayer wiring with lamination of multiple wiring layers in the step of forming the wiring is performed along with the miniaturization of design rules for semiconductor elements, an etch back process (recessing process) for inhibiting a reduction in yield due to any leakage current in the occurrence of pattern displacement is needed in order to realize multilayer wiring. That is, any surface roughness caused by etching of metals forming wiring layers leads to an increase in contact resistance between wiring layers and thus an etching treatment which allows metal surface roughness to be inhibited is one of the most important items. Of course, the rate of metal dissolution, namely, the etching rate is also important in terms of throughput, and there is a need for a treatment liquid for a semiconductor, which is sufficient in etching rate of a metal and which causes less surface roughness after etching.

There are proposed various liquids as treatment liquids for use in wet etching of metals, such as ruthenium, on wafers for semiconductors. For example, Patent Document 1 proposes, as a method for etching a ruthenium film, a method involving etching a ruthenium film with a chemical solution in which the pH is 12 or more and the standard oxidation-reduction potential is 300 mV or more, vs. SHE (standard hydrogen electrode), specifically, a solution including halogen oxoate such as hypochlorite, chlorite, or bromate. Patent Document 2 proposes a washing method involving oxidizing, dissolving, and removing ruthenium, with a removal liquid in which a strong acid such as nitric acid is further added to ammonium cerium (IV) nitrate.

Furthermore, Patent Document 3 proposes a wafer treatment liquid including hypochlorite ion and a solvent and having ruthenium, in which the pH 25° C. is more than 7 and less than 12.0, as a treatment liquid for use in etching of a metal on a wafer for a semiconductor.

RELATED ART DOCUMENT

Patent Document

Patent Document 1: Japanese Patent Application Publication No. 2002-161381
Patent Document 2: Japanese Patent Application Publication No. 2001-234373
Patent Document 3: International Publication No. WO 2019/142788
Patent Document 4: Japanese Patent Application Publication No. 2019-218436

SUMMARY OF THE INVENTION

Problems to be Solved by the Invention

Each of the treatment liquids disclosed in Patent Documents 1 to 3 contains an oxidizing agent for ruthenium, and oxidizes and thus removes ruthenium. Such each treatment liquid can remove ruthenium at a high etching rate, and is a treatment liquid particularly useful for removal of any metal, such as ruthenium, attached on an edge surface part (bevel) and a back surface part of a semiconductor wafer.

It is necessary in the above-mentioned etch back process to accurately control the etching rate on a treatment surface. Specifically, it is necessary to control the roughness on a surface on which etching is to be performed, to a level of about 3 nm or less. However, there has not been mentioned any smoothness of a treatment surface after an etching treatment, with respect to each of the treatment liquids disclosed in Patent Documents 1 to 3, and the present inventors have performed etching of ruthenium with such each treatment liquid, and thus have found that, although the etching rate is very high, the roughness on a surface after such etching is difficult to control, and there is room for improvement in smoothness of the surface after the etching.

In view of the above problems, the present inventors have focused on ionic species contained in a treatment liquid including hypochlorite ion, in order to control surface roughness after etching, and have found that an oxidizing composition including hypochlorite ion and quaternary alkylammonium ion can be allowed to contain a small amount of chlorite ion, to thereby allow the etching rate to be controlled to 20 Å/min or less, resulting in precise control of storage stability of hypochlorite ion and the etching rate, and suppression of surface roughness after etching (see Patent Document 4).

The treatment liquid disclosed in Patent Document 4 can be used to thereby perform etching with surface roughness after the etching being inhibited, and the treatment liquid is suitable for an etch back process. However, the treatment liquid is very low in etching rate, and there has been still room for improvement in terms of inhibition of surface roughness after etching at a high etching rate.

Accordingly, an object of the present invention is to provide a semiconductor wafer treatment liquid which is sufficient in etching rate of a metal for use in a wiring layer of a semiconductor element and which can inhibit metal surface roughness due to etching.

Means for Solving the Problems

The present inventors have made intensive studies in order to solve the above problems. First, the inventors have advanced studies about an additive which can allow the etching rate of ruthenium with a treatment liquid including hypochlorite ion to be adjusted, and as a result, have found that the etching rate with the treatment liquid can be controlled by allowing anion species other than the hypochlorite ion to be present in the treatment liquid. The inventors have further advanced studies about the anion species present in the treatment liquid, and as a result, have found that halate ion, halite ion, and halide ion are present in specified amounts to thereby not only allow a sufficient etching rate of ruthenium to be kept and inhibit surface roughness due to etching, but also allow the same effect with respect to any metal other than ruthenium to be exerted, thereby completing the present invention.

Specifically, the present invention is configured as follows.

Aspect 1 A semiconductor wafer treatment liquid, the treatment liquid comprising:
at least one hypohalite ion; and
at least one anion species selected from halate ion, halite ion and halide ion; wherein
at least one of the anion species has a content of 0.30 mol/L or more and 6.00 mol/L or less relative to the treatment liquid.

Aspect 2 The semiconductor wafer treatment liquid according to Aspect 1, comprising two or more anion species, as the anion species.

Aspect 3 The semiconductor wafer treatment liquid according to Aspect 1 or 2, comprising at least one of halide ion as the anion species having a content of 0.30 mol/L or more and 6.00 mol/L or less relative to the treatment liquid.

Aspect 4 The semiconductor wafer treatment liquid according to any one of Aspects 1 to 3, wherein the hypohalite ion has a content of 0.0010 mol/L or more and 4.00 mol/L or less relative to the treatment liquid.

Aspect 5 The semiconductor wafer treatment liquid according to any one of Aspects 1 to 4, comprising at least one of ion species selected from hypochlorite ion and hypobromite ion, as the hypohalite ion.

Aspect 6 The semiconductor wafer treatment liquid according to Aspect 5, comprising hypochlorite ion and hypobromite ion, as the hypohalite ion.

Aspect 7 The semiconductor wafer treatment liquid according to any one of Aspects 1 to 6, comprising at least hypobromite ion, as the hypohalite ion, wherein the hypobromite ion has a content of 0.0010 mol/L or more and 0.20 mol/L or less relative to the treatment liquid.

Aspect 8 The semiconductor wafer treatment liquid according to any one of Aspects 1 to 7, wherein the treatment liquid further comprises onium ion.

Aspect 9 The semiconductor wafer treatment liquid according to any one of Aspects 1 to 8, wherein a pH of the treatment liquid is 7 or more and 14 or less.

Aspect 10 The semiconductor wafer treatment liquid according to any one of Aspects 1 to 9, wherein the semiconductor wafer comprises at least one metal selected from Ru, Rh, Ti, Ta, Co, Cr, Hf, Os, Pt, Ni, Mn, Cu, Zr, La, Mo, and W.

Aspect 11 A method for producing a semiconductor wafer treatment liquid, the method comprising:
preparing a first solution comprising at least one of anion species selected from halate ion, halite ion, and halide ion;
preparing a second solution comprising hypohalite ion; and
mixing the first solution and the second solution.

Aspect 12 The method for producing a semiconductor wafer treatment liquid according to Aspect 11, wherein an oxidative power of the hypohalite ion comprised in the second solution is higher than an oxidative power of the anion species comprised in the first solution.

Aspect 13 The method for producing a semiconductor wafer treatment liquid according to Aspect 11 or 12, wherein at least one of the anion species comprised in the first solution is bromide ion, and the hypohalite ion comprised in the second solution is hypochlorite ion.

Aspect 14 The method for producing a semiconductor wafer treatment liquid according to any one of Aspects 11 to 13, wherein at least one solution selected from the first solution and the second solution comprises onium ion.

Aspect 15 The method for producing a semiconductor wafer treatment liquid according to Aspect 14, wherein the first solution and the second solution each comprise onium ion.

Aspect 16 A kit for preparing a semiconductor wafer treatment liquid, the kit comprising at least a first solution comprising at least one of anion species selected from halate ion, halite ion and halide ion, and a second solution comprising hypohalite ion.

Aspect 17 The kit according to Aspect 16, wherein an oxidative power of the hypohalite ion comprised in the second solution is higher than an oxidative power of the anion species comprised in the first solution.

Aspect 18 The kit according to Aspect 16 or 17, wherein at least one of the anion species comprised in the first solution is bromide ion, and the hypohalite ion comprised in the second solution is hypochlorite ion.

Effect of the Invention

The semiconductor wafer treatment liquid of the present invention can allow a sufficient etching rate of a metal, in particular ruthenium, for use in a wiring layer of a semiconductor element to be kept and can inhibit surface roughness due to etching, and further improve a stability of the treatment liquid.

MODE FOR CARRYING OUT THE INVENTION (Semiconductor Wafer Treatment Liquid)

The semiconductor wafer treatment liquid of the present invention (hereinafter, also simply referred to as "treatment liquid") includes at least one hypohalite ion, and at least one anion species selected from halate ion, halite ion and halide ion, in which at least one of the anion species has a content of 0.30 mol/L to 6.00 mol/L. The semiconductor wafer treatment liquid of the present invention can allow a sufficient etching rate of ruthenium or the like to be kept and can inhibit surface roughness due to etching. The designation "A to B" with respect to numerical values A and B herein means "A or more and B or less", unless particularly noted. In cases where only the numerical value B in the designation is marked with a unit, the unit also applies to the numerical value A.

While a plurality of embodiments are described herein, conditions in such respective embodiments can be applied to each other within any applicable range.

The reason why the semiconductor wafer treatment liquid of the present invention allows a sufficient etching rate of ruthenium to be kept and inhibits surface roughness due to etching is presumed by the present inventors, as follows. In other words, it is presumed that, in cases where a treatment liquid including hypohalite ion is used as an etching liquid of ruthenium, for example, in cases where hypochlorite ion is used, ruthenium is oxidized and removed according to the following reaction (Expression 1).

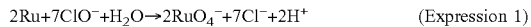
(Expression 1)

The treatment liquid of the present invention is characterized by containing, in addition to hypohalite ion, specified amount(s) of anion species selected from halate ion, halite ion and halide ion. It is presumed that such anion species is present in a certain uniform manner also on the surface of ruthenium in the treatment liquid, and it is thus presumed that the etching rate of ruthenium with hypohalite ion can be controlled at a certain level. It is then presumed that the etching rate of ruthenium can be reduced to thereby allow surface roughness due to etching to be inhibited.

It has been conventionally considered that ruthenium is difficult to dissolve, and it is thus presumed that the etching liquid of ruthenium can be reduced in content of other anion species as much as possible to thereby promote the reaction with hypohalite ion on the surface of ruthenium, and thus increased in etching rate.

The hypohalite ion not only is consumed by the reaction, but also is decreased in concentration thereof in the treatment liquid according to the following disproportionation reaction (Expression 2).

(Expression 2)

The treatment liquid of the present invention contains specified amounts of at least one anion species selected halate ion, halite ion and halide ion, and thus it is presumed that the reaction of the hypohalite ion is hindered to thereby inhibit the content of the hypohalite ion from being decreased and it is presumed that a high etching rate and a good stability can be thus maintained.

In other words, it is considered that the disproportionation reaction rate of hypochlorite ion or hypobrominite ion can be reduced by previously including chloride ion or bromide ion which is a decomposition product of the disproportionation reaction in the treatment liquid of the present invention. Thus, the change in the concentration of hypochlorite ion or hypobrominite ion which is a chemical species for etching ruthenium is reduced, not only the etching rate of ruthenium is stabilized, but also the storage stability of the treatment liquid is improved, and a liquid life of the treatment liquid can be extended.

Thus, the semiconductor wafer treatment liquid of the present invention is used and therefore not only the wafer treatment efficiency per unit time is enhanced, but also, for example, the treatment liquid can be suitably used as a treatment liquid for use in an etch back process of a metal in a semiconductor production process, in which precise etching of a wiring material is required to be controlled. The treatment liquid also has the same effect on a metal other than ruthenium, and therefore can be used as a treatment liquid of a metal included in a semiconductor wafer without any limitation on ruthenium.

Hereinafter, each component of the semiconductor wafer treatment liquid of the present invention will be described in detail.

(Hypohalite Ion)

The hypohalite ion included in the treatment liquid of the present invention serves as an oxidizing agent of a metal such as ruthenium, and etches a metal layer by forming a metal oxide and/or changing a metal into ionic species.

Specific examples of the hypohalite ion included in the treatment liquid of the present invention include hypochlorite ion (ClO$^-$), hypobromite ion (BrO$^-$), or hypoiodite ion (IO$^-$). In particular, at least one selected from hypochlorite ion and hypobromite ion is preferably included as the hypohalite ion from the viewpoint of the etching rate of a metal, and stability during storage or in use. In cases where a semiconductor wafer including ruthenium as a metal is subjected to an etching treatment, hypobromite ion is particularly preferable from the viewpoint of the etching rate of ruthenium and the ability to inhibit the occurrence of a toxic ruthenium gas (RuO$_4$) easily generated by oxidation of ruthenium. The hypohalite ion may be used singly or two or more kinds thereof may be included and used. For example, two kinds, hypochlorite ion and hypobromite ion, may be included as the hypohalite ion included in the treatment liquid of the present invention.

The hypohalite ion for use in the present invention can be generated by dissolving hypohalous acid or hypohalite in the treatment liquid. Examples of the hypohalite include an alkali metal salt, an alkali earth metal salt, or an organic salt. Specific examples of the alkali metal salt include sodium hypochlorite, sodium hypobromite, or sodium hypoiodite, and specific examples of the organic salt include an organic salt including an onium ion such as a quaternary alkylammonium salt such as tetramethylammonium hypochlorite, tetramethylammonium hypobromite, or tetramethylammonium hypoiodite. In particular, an organic salt including onium ion such as a quaternary alkylammonium salt not including any metal causing a reduction in yield in the step of forming a semiconductor is preferably used, and tetramethylammonium hypochlorite or tetramethylammonium hypobromite is particularly preferably used.

The hypohalite here used may be an industrially available salt or may be prepared according to a known method. For example, the quaternary alkylammonium salt can be prepared by preparing an aqueous tetramethylammonium hydroxide solution and blowing chlorine, bromine, or the like thereinto. A solution including quaternary alkylammonium hypohalite can also be prepared by a method involving contacting a tetramethylammonium hydroxide solution with a cation exchange type ion exchange resin, changing a cation in the ion exchange resin to tetramethylammonium ion, and then exchanging the tetramethylammonium ion with sodium ion under a stream of a sodium hypohalite solution.

(Concentration of Hypohalite Ion)

The concentration of the hypohalite ion in the treatment liquid of the present invention is not particularly limited without departing from the objects of the present invention, and can be appropriately set depending on the type of metal species to be etched, and the portion of etching. The concentration is preferably within the range of 0.0010 mol/L or more and 4.00 mol/L or less, more preferably within the range of 0.0050 mol/L or more and 2.00 mol/L or less, particularly preferably within the range of 0.010 mol/L or more and 0.80 mol/L or less, relative to the treatment liquid, from the viewpoint of the etching rate of a metal, and stability during storage or in use, or the like. In cases where two or more kinds of such hypohalite ions are included as the hypohalite ion, the total concentration of such hypohalite ions may be within the above range. The "concentration" is herein also referred to as "content".

For example, in cases where hypochlorite ion is included as the hypohalite ion, the concentration range of hypochlorite ion is more preferably 0.020 mol/L or more and 3.00 mol/L or less, further preferably 0.060 mol/L or more and 2.00 mol/L or less, further preferably 0.10 mol/L or more and 1.20 mol/L or less, particularly preferably 0.10 mol/L or more and 0.80 mol/L or less.

In cases where hypobromite ion is included as the hypohalite ion, the hypobromite ion has a concentration range of more preferably 0.0010 mol/L or more and 0.20 mol/L or less. In the case of less than 0.0010 mol/L, the etching rate of a metal tends to be low. On the other hand, in the case of more than 0.20 mol/L, decomposition of the hypobromite ion easily occurs and thus the etching rate of a metal is hardly stable. Accordingly, the hypobromite ion has a concentration of more preferably 0.0010 mol/L or more and 0.20 mol/L or less, further preferably 0.0050 mol/L or more and 0.20 mol/L or less, most preferably 0.010 mol/L or more and 0.10 mol/L or less, in order to stably perform etching of a metal at a sufficient rate.

In cases where hypobromite ion is used as the hypohalite ion, hypochlorite ion is preferably included additionally. In cases where hypobromite ion is used, a reaction thereof with a metal such as ruthenium generates bromide ion. If hypochlorite ion is here contained, the oxidation-reduction potential (0.89 V (at 25° C., pH 14, vs. standard hydrogen electrode)) of hypochlorite ion-chloride ion is higher than the oxidation-reduction potential (0.76 V (same as above)) of hypobromite ion-bromide ion and thus bromide ion generated is oxidized to produce hypobromite ion. Accordingly, in cases where hypobromite ion is used, hypochlorite ion is preferably included additionally because hypobromite ion can be thus maintained at a predetermined concentration and the etching rate is easily stably controlled.

In cases where not only hypobromite ion, but also hypochlorite ion is included additionally, the content ratio between hypobromite ion and hypochlorite ion, hypobromite ion (mol)/hypochlorite ion (mol), is preferably within the range of 0.001 or more and 100 or less, more preferably within the range of 0.1 or more and 50 or less, particularly preferably within the range of 0.5 or more and 10 or less, from the viewpoint that the etching rate can be stably controlled.

The concentration of the hypohalite ion in the treatment liquid can also be determined by calculation in production of the treatment liquid, or can also be confirmed using a known method. The measurement method can be specifically an ultraviolet/visible spectrophotometric method in which the concentration of the hypohalite ion is determined by confirming absorption due to the hypohalite ion and creating a calibration curve by use of the peak intensity of the absorption and a hypohalite ion solution having a known concentration.

(Anion Species)

The treatment liquid of the present invention includes at least one anion species selected from halate ion, halite ion and halide ion. It is presumed that these anion species interact with a metal to thereby inhibit surface roughness. Specific examples of the anion species include halate ion such as $ClO_3^-$, $BrO_3^-$, or $IO_3^-$; halite ion such as $ClO_2^-$, $BrO_2^-$, or $IO_2^-$; or halide ion such as $Cl^-$, $Br^-$, or $I^-$. The anion species may be included singly in the treatment liquid or two or more of these anion species may be included therein. In cases where two or more of these anion species are included, for example, ions which are the same in oxidation number of a halogen atom, for example, two kinds of halate ions may be included, or ions which are different in oxidation number of a halogen atom, for example, one kind of halite ion and one kind of halide ion may be included.

The "anion species" herein represents at least one anion species selected from halate ion, halite ion and halide ion, unless particularly noted.

In particular, halide ion is preferably included as the anion species from the viewpoint of dissolution properties in the treatment liquid, availability, storage stability, cost, and the like, particularly, as anion species included in a concentration range of anion species described below. For example, tetramethylammonium chloride which is to be dissolved to thereby generate chloride ion as one halide ion is extremely high in solubility (under conditions of 70 weight % or less and 25° C.), and is also small in temperature dependence of solubility, and thus hardly produces a precipitate which can cause a decrease in etching rate and an increase in surface roughness. The treatment liquid more preferably includes two or more anion species. In cases where the treatment liquid includes two or more anion species, the treatment liquid particularly preferably includes halide ion and anion species different in oxidation number of a halogen atom from the halide ion, from the viewpoint of effectively inhibiting metal surface roughness.

The anion species for use in the present invention can be generated by dissolving an acid, a salt, or the like including the anion species in the treatment liquid. Examples of the acid including the anion species include halogen acid such as chloric acid, bromic acid, or iodic acid; halous acid such as chlorous acid, bromous acid, or iodous acid; or hydrogen halide such as hydrogen chloride, hydrogen bromide, or hydrogen iodide. Examples of the salt including the anion species include an alkali metal salt, an alkali earth metal salt, or an organic salt. Specific examples of the alkali metal salt include potassium chloride, sodium chlorite, potassium bromide, sodium bromite, potassium iodide, or sodium iodite, and specific examples of the organic salt include an organic salt including an onium ion, for example, a quaternary alkylammonium salt such as tetramethylammonium chloride, tetramethylammonium bromide, or tetramethylammonium iodide. The hydrogen halide can also be generated by dissolving a gas such as a chlorine gas, a bromine gas, or an iodine gas in water. In particular, an acid or an organic salt compound including the anion species is preferably used because of including no metal causing a reduction in yield in semiconductor production, and furthermore an organic salt including an onium ion, for example, a quaternary alkylammonium salt is further preferable in consideration of industrial availability and ease of handling. Examples of the organic salt compound, which can be particularly suitably used from the viewpoint of stability, purity, and cost, include tetramethylammonium chloride, bromide or iodide, or tetraethylammonium chloride, bromide or iodide, or tetrapropylammonium chloride, bromide or iodide.

The acid, salt, or the like including the anion species for use in generation of the anion species in the treatment liquid may be an industrially available salt or may be prepared by a known method. For example, the quaternary alkylammonium salt including the anion species can be prepared by preparing an aqueous tetramethylammonium hydroxide solution and blowing chlorine, bromine, or the like thereinto. A solution including the quaternary alkylammonium salt of the anion species can also be prepared by a method involving contacting a tetramethylammonium hydroxide solution with a cation exchange type ion exchange resin, changing a cation in the ion exchange resin to tetramethylammonium ion, and then exchanging the ion under a stream of a halogen acid such as hydrochloric acid, bromic acid, or iodic acid.

(Concentration of Anion Species)

At least one of the anion species in the treatment liquid of the present invention has a concentration of 0.30 mol/L or more and 6.00 mol/L or less. In cases where one kind of the anion species is contained in the treatment liquid of the present invention, the anion species is needed to be included at 0.30 mol/L or more and 6.00 mol/L or less in the treatment liquid. In cases where two or more kinds of such anion species are contained in the treatment liquid, at least one of such anion species contained is needed to be included at 0.30 mol/L or more and 6.00 mol/L or less in the treatment liquid. The anion species can be contained within the above range in the treatment liquid to thereby not only allow a sufficient etching rate of a metal such as ruthenium to be kept, but also allow surface roughness due to etching to be inhibited. The concentration of the anion species is more preferably 0.30 mol/L or more and 3.00 mol/L or less, most preferably 0.30 mol/L or more and 1.00 mol/L or less, from the viewpoint that both sufficient etching rate and smoothness are achieved.

The above range can be applied to the total concentration of the anion species in the treatment liquid of the present invention.

In cases where two or more kinds of such anion species included are included in the treatment liquid, halide ion is preferably adopted as the anion species at a concentration of, for example, 0.30 mol/L or more and 6.00 mol/L or less described above, from the viewpoint that both sufficient etching rate and smoothness are achieved. In cases where two or more kinds of such anion species are included, any anion species other than the anion species in the above concentration range is not particularly limited in terms of the concentration range thereof, and the concentration range can be appropriately set depending on the type of metal species to be etched, and the portion of etching, and the concentration of such any other anion species can be 0.30 mol/L or more and 6.00 mol/L or less. A too high concentration of the anion species tends to result in a reduction in etching rate, and a too low concentration thereof tends to result in deterioration in effect of inhibiting surface roughness. Thus, in cases where two or more kinds of such anion species are included, the total concentration thereof is preferably 6.00 mol/L or less, more preferably 3.00 mol/L or less, most preferably 1.00 mol/L or less.

The ratio (Concentration of anion species/Concentration of hypohalite ion) of the concentration (mol/L) of the at least one anion species to the concentration (mol/L) of the hypohalite ion, in the treatment liquid, is not particularly limited, and is usually 2 or more, preferably 4 or more, more preferably 6 or more, further preferably 8 or more, and usually 500 or less, preferably 200 or less, more preferably 50 or less, further preferably 10 or less, and furthermore, usually 2 or more and 500 or less, preferably 4 or more and 200 or less, more preferably 6 or more and 50 or less, further preferably 8 or more and 10 or less, from the viewpoint of effective inhibition of metal surface roughness.

The concentration of the anion species in the treatment liquid can be measured using an ion chromatographic method. This method can be used to thereby allow for identification and quantitative determination of the anion species by appropriately setting the type and conditions of a column.

(Onium Ion)

The treatment liquid of the present invention preferably further includes onium ion. Not only the anion species, but also onium ion can be included to thereby more inhibit metal surface roughness. A mechanism in which onium ion is included to thereby inhibit surface roughness is presumed by the present inventors, as follows, namely, onium ion and the anion species or the surface of a metal can interact with each other to thereby allow for uniform etching of the metal.

Specific examples of the onium ion which can be used in the treatment liquid of the present invention include ammonium ion ($NH_4^+$), phosphonium ion ($PH_4^+$), or sulfonium ion ($SH_3^+$). Each hydrogen atom of such onium ion is independently optionally substituted. Specific examples of such a substituent include an alkyl group having carbon number of 1 or more and 25 or less, an allyl group having carbon number of 1 or more and 25 or less, an aralkyl group having carbon number of 7 or more and 11 or less, or an aryl group having carbon number of 6 or more and 10 or less. Any hydrogen atom in the aryl group in the aralkyl group, and the aryl group, among the above substituents, is optionally substituted and examples of such a substituent include a fluorine atom, a chlorine atom, an alkyl group having carbon number of 1 or more and 15 or less, an alkenyl group having carbon number of 2 or more and 10 or less, an alkoxy group having carbon number of 1 or more and 9 or less, or an alkenyloxy group having carbon number of 2 or more and 9 or less.

All hydrogen atoms of the onium ion are each independently preferably substituted with an alkyl group having carbon number of 1 or more and 25 or less, more preferably substituted with an alkyl group having carbon number of 2 or more and 10 or less, most preferably substituted with an alkyl group having carbon number of 3 or more and 6 or less, from the viewpoint that the effect of inhibiting metal surface roughness is high. Specific examples of such onium ion include tetrapropylammonium ion or tetrabutylammonium ion.

Two kinds of the onium ions can be bound to each other via an alkylene group. The carbon number of the alkylene group for binding two kinds of the onium ions is preferably 2 or more and 10 or less. Specific examples of such each onium ion include hexamethonium ion or decamethonium ion.

The onium ion can have an alicyclic structure or a heterocyclic structure, in which two hydrogen atoms of the onium ion are bound to each other via an alkyl group or an alkylene group. Specific examples of the onium ion include piperidinium ion, imidazolium ion, pyrrolidinium ion, oxazolium ion, or pyridinium ion. Such ring structures can each have a substituent. Specific examples of such a substituent include chlorine, bromine, fluorine, iodine, an alkyl group having carbon number of 1 or more and 15 or less, an alkenyl group having carbon number of 2 or more and 10 or less, an alkoxy group having carbon number of 1 or more and 9 or less, or an alkenyloxy group having carbon number of from 2 or more and 9 or less. Specific examples of the onium ion having the ring structure include 1,1-dimethylpiperidinium ion, 1-butyl-2,3-dimethylimidazolium ion, 1-butyl-1-methylpyrrolidinium ion, or 5-azoniaspiro[4,4] nonane ion.

Two kinds of the onium ions each having the ring structure can be bound to each other via an alkylene group. The carbon number of the alkylene group for binding two kinds of the onium ions is preferably 2 or more and 10 or less. Specific examples of such each onium ion include 3,3'-methylenebis(1-tert-butyl-3-imidazolium)ion or 3,3'-methylenebis(1-(2,6-diisopropylphenyl)-3-imidazolium)ion.

In cases where the onium ion is contained in the treatment liquid of the present invention, the concertation of the onium ion is not particularly limited, and may be appropriately determined in consideration of metal species or the like to be included in the treatment liquid. When the concertation of the onium ion is too high, a reduction in etching rate and heterogeneous etching of the surface of a metal tend to be caused. On the other hand, when the concertation of the onium ion is too low, not only the effect of inhibiting surface roughness tends to be deteriorated, but also the amount of a metal which can be treated tends to be decreased to result in a decrease in number of times of reuse of the treatment liquid. Accordingly, the concertation of the onium ion is usually 0.000010 mol/L or more and 7.00 mol/L or less, usually preferably 0.000010 mol/L or more and 6.00 mol/L or less, more preferably 0.000010 mol/L or more and 3.00 mol/L or less, further preferably 0.0010 mol/L or more and 2.00 mol/L or less, particularly preferably 0.010 mol/L or more and 1.00 mol/L or less. Examples of the method for adding the onium ion to the treatment liquid of the present invention include a method involving dissolving an onium salt including the onium ion and anion in the treatment liquid of the present invention to thereby generate the onium ion. In cases where the onium ion is included as a counter ion of the hypohalite ion and/or the anion species, the concertation of the onium ion may be determined in consideration of the content of the onium ion. In this regard, in cases where the hypohalite ion and/or an onium salt of the anion species are/is used for preparation of the treatment liquid of the present invention, the total concentration of the onium salt added and the onium ion additionally added may be set so as to be within the range. In cases where no hypohalite ion and/or no onium ion of the anion species are/is used for preparation of the treatment liquid of the present invention, a compound including the onium ion can be added so that the concertation of the onium ion added is within the range. In cases where the onium ion is added, the onium ion can be added singly or in combination of two or more kinds thereof. Two or more of the onium ions can also be included.

(Solvent)

The balance other than the hypohalite ion and the anion species, and other additives described below in detail, in the treatment liquid of the present invention, is a solvent, and the balance is adjusted with the solvent so that the total after preparation of each of the components is 100 weight %.

The solvent here used is most preferably water. The water included in the treatment liquid of the present invention is preferably water from which any metal ion, organic impurities, particles, and the like are removed by, for example, a distillation treatment, an ion exchange treatment, a filter treatment, or various adsorption treatments, particularly preferably pure water or ultrapure water.

An organic solvent can also be used as long as the hypohalite ion is stably present. The organic solvent here used is, for example, acetonitrile or sulfolane.

The water and the organic solvent can be used in combination, as the solvent. The water and the organic solvent can be used in combination to thereby allow oxidation of a metal such as Ru to relatively mildly progress and thus inhibit wiring or the like of a circuit formation section from being oxidized. In cases where the water and the organic solvent are used in combination, the weight ratio (water/organic solvent) between the water and the organic solvent can be about 60/40 or more and 99.9/0.1 or less.

The content of the solvent in the treatment liquid is not particularly limited, and is usually 30 weight % or more, preferably 80 weight % or more, more preferably 90 weight % or more, further preferably 94 weight % or more, and usually 99 weight % or less, preferably 98 weight % or less, more preferably 97 weight % or less from the viewpoint that the above components can be sufficiently dissolved.

(Metal Concentration)

The treatment liquid of the present invention may contain a metal (or metal ion, hereinafter referred to as "metal" including metal ion) due to the addition of anionic species or onium ions, or in a process of producing the treatment liquid. Specific examples of metals included include lithium, sodium, potassium, aluminum, magnesium, calcium, chromium, manganese, iron, nickel, cobalt, copper, silver, cadmium, barium, zinc, or lead, or ions thereof. However, since these metals can affect the stability of alkylammonium salts, their amounts are preferably small. The cause of this is not clear, but it is considered that a metal acts as catalysts for the decomposition of alkyl groups in alkali and promotes the decomposition reaction. On the other hand, although the content of the metal in the treatment liquid is preferably small, the inclusion of a small amount of metal makes it possible to maintain a flatness of the metal surface after an etching treatment (prevent surface roughness). Therefore, as a content of the metal in the treatment liquid, a content of any one of metals selected from lithium, sodium, potassium, aluminum, magnesium, calcium, chromium, manganese, iron, nickel, cobalt, copper, silver, cadmium, barium, zinc, and lead is, on a mass basis, preferably 0.01 ppt or more and 1 ppb or less, more preferably 1 ppt or more and 1 ppb or less, further preferably 1 ppt or more and 500 ppt or less, and most preferably 10 ppt or more and 200 ppt or less. Further, when these metals remain on a semiconductor wafer, these metals exert an adverse effect on the semiconductor wafer (an adverse effect such as a decrease in the yield of the semiconductor wafer).

When the content of the metal exceeds 1 ppb, the content can be suppressed to 1 ppb or less by filtration, distillation, ion exchange, or the like.

The content of the metal in the treatment liquid can be measured using an inductively coupled plasma mass spectrometer (for example, ICP-MS, Agilent 8900, manufactured by Agilent Technologies), as described in the embodiments described below.

(Other Additives)

Any of additives conventionally used in a treatment liquid for a semiconductor can be optionally compounded in the treatment liquid of the present invention as long as the object of the present invention is not impaired. For example, such additives, such as an acid, a metal anticorrosive agent, a fluorine compound, an oxidizing agent, a reducing agent, a chelating agent, a surfactant, a pH adjuster, or an antifoaming agent can be added.

(pH of Semiconductor Wafer Treatment Liquid)

The pH of the treatment liquid is preferably 7 or more and 14 or less in order that not only the semiconductor wafer treatment liquid of the present invention is inhibited from being decomposed during storage and use of the treatment liquid, but also a metal is treated smoothly at a sufficient etching rate. In cases where the pH is less than 7, decomposition of the hypohalite ion serving as the oxidizing agent progresses and thus the etching rate tends not to be stable.

In cases where the pH is more than 14, a metal is hardly dissolved and a sufficient etching rate tends to be difficult to obtain. In cases where the hypohalite ion is hypochlorite ion, the pH of the treatment liquid is more preferably 7 or more and 13 or less, more preferably 8 or more and 12 or less, most preferably 8.5 or more and 11 or less, from the viewpoint of stability of the treatment liquid and the etching rate. In cases where the hypohalite ion is hypobromite ion, the pH of the treatment liquid is preferably 7 or more and 14 or less, more preferably 8 or more and 14 or less, most preferably 9 or more and less than 13, from the same reason as described above. In cases where the hypohalite ion includes both hypobromite ion and hypochlorite ion, the pH of the treatment liquid is preferably 7 or more and 14 or less, more preferably 8 or more and 14 or less, most preferably 9 or more and 13 or less, from the same reason as described above.

An acid or an alkali can be added to the treatment liquid in order to adjust the pH of the treatment liquid. The acid can be any of an inorganic acid or an organic acid, one example thereof is hydrofluoric acid, hydrochloric acid, hydrobromic acid, nitric acid, acetic acid, sulfuric acid, peroxydisulfuric acid, or formic acid, and any known acid for use in a treatment liquid for a semiconductor, other than such an acid, can also be widely used without any limitations. An organic alkali is preferably used as the alkali because the organic alkali does not include any metal ion causing a reduction in yield in semiconductor production. The organic alkali is preferably tetraalkylammonium hydroxide which is industrially available and which easily stably coexists with the oxidizing agent included in the treatment liquid. Examples of such tetraalkylammonium hydroxide include tetramethylammonium hydroxide, tetraethylammonium hydroxide, tetrapropylammonium hydroxide, tetrabutylammonium hydroxide, or choline. In particular, the organic alkali is more preferably tetramethylammonium hydroxide because the number of hydroxide ions per unit weight is large and a high-quality article is easily available.

(Oxidation-Reduction Potential of Semiconductor Wafer Treatment Liquid)

The oxidation-reduction potential (at 25° C., pH 14, vs. standard hydrogen electrode) of the semiconductor wafer treatment liquid of the present invention is not particularly limited, and is preferably 500 mV or more and 1500 mV or less, more preferably 550 mV or more and 1500 mV or less, further preferably 650 mV or more and 1500 mV or less. When the oxidation-reduction potential is less than 500 mV, a tendency is that the oxidative power is low and the etching rate is low. On the other hand, when the oxidation-reduction potential is more than 1500 mV, a tendency is that, while the oxidative power is high, the hypohalite ion is easily decomposed and the treatment liquid is thus unstable.

The oxidation-reduction potential of the treatment liquid can be easily controlled by appropriately adjusting, for example, the type and/or concentration of the hypohalite ion, halate ion, halite ion or halide ion included in the treatment liquid, the types and/or concentrations of other additives described above, the pH of the treatment liquid, or the temperature of the treatment liquid. The semiconductor wafer treatment liquid of the present invention, which has an oxidation-reduction potential in the above range thus controlled, can be suitably utilized as a treatment liquid of a metal included in a semiconductor wafer.

(Method for Producing Semiconductor Wafer Treatment Liquid)

The method for producing the semiconductor wafer treatment liquid of the present invention is not particularly limited. Specifically, the treatment liquid of the present invention can be obtained by adding respective compounds generating the hypohalite ion and the anion species, to a solvent such as water so that desired concentrations are achieved, adding additive(s) if necessary added, and adjusting the resultant to a desired pH. Alternatively, the treatment liquid of the present invention can be obtained by preparing a plurality of solutions (hereinafter, also simply referred to as "materials for preparation"), in which respective components are separately compounded, and mixing such materials for preparation immediately before a treatment of a semiconductor wafer. In cases where the treatment liquid of the present invention is obtained by preparing and mixing such a plurality of materials for preparation, each component included in the materials for preparation can also be one so that any of the hypohalite ion and/or the anion species is generated by mixing the materials for preparation and then reacting components in the materials for preparation. The treatment liquid of the present invention can vary in, for example, pH and composition of the treatment liquid over time, and thus can vary in etching performance, for example, the etching rate. Accordingly, the treatment liquid of the present invention is preferably obtained by preparing a plurality of materials for preparation and mixing the materials for preparation immediately before a treatment of a semiconductor wafer, from the viewpoint of inhibition of deterioration in etching performance over time. In cases where a plurality of materials for preparation are prepared, the number of such materials for preparation, while such materials can be prepared with respect to each thereof, is determined, and two kinds of such materials for preparation are preferably adopted in consideration of, for example, operation ability in mixing.

Hereinafter, there will be described one embodiment of the present invention, which is a method for producing a semiconductor wafer treatment liquid, specifically a production method including a step of preparing a first solution (material 1 for preparation) (first solution preparation step), a step of preparing a second solution (material 2 for preparation) (second solution preparation step), and a step of mixing these materials for preparation (preferably, immediately before a treatment of a semiconductor wafer) (mixing step). The semiconductor wafer treatment liquid can be produced by the method. The present production method can also include any step other than the above-mentioned first solution adjustment step, second solution adjustment step, and mixing step.

(Material for Preparation)

An advantage of use of two kinds of the materials for preparation, the first solution and the second solution is, for example, an enhancement in stability of etching performance in cases where relatively unstable hypohalite ion is to be used in the treatment liquid. In this regard, in cases where the treatment liquid is one liquid, any time is taken until a treatment of a semiconductor wafer in a semiconductor production plant after production of the hypohalite ion, and thus etching performance, for example, the etching rate can be changed by decomposition of the hypohalite ion. On the other hand, in cases where the hypohalite ion is generated by preparing the treatment liquid in the form of two kinds of the materials for preparation, the first solution and the second solution, and mixing such material 1 for preparation and material 2 for preparation, a treatment liquid including the hypohalite ion is produced immediately before a treatment of a semiconductor wafer in a semiconductor production plant and thus decomposition of the hypohalite ion can be inhibited and stable etching performance can be exhibited.

In particular, in cases where the treatment liquid of the present invention is used for the etch back process, microfabrication is needed and precise control of the etching rate and surface roughness is needed, and thus the above aspect is preferable. Each of the materials for preparation, herein, can be handled as the semiconductor wafer treatment liquid, and in this case, can also be referred to as "material for semiconductor wafer treatment liquid preparation".

Accordingly, in cases where the treatment liquid is prepared in the form of two kinds of the materials for preparation, the first solution and the second solution, components in such two kinds of solutions constituting the respective materials for preparation are preferably as follows, from the viewpoint of storage stability of the materials for preparation by themselves, and from the viewpoint that metal surface roughness can be stably inhibited.

First solution: solution including at least one anion species selected from halate ion, halite ion, and halide ion
Second solution: solution including hypohalite ion While an aspect can be adopted where the material for preparation include only the material 1 for preparation and the material 2 for preparation, the material can include any material for preparation other than these materials for preparation.

In cases where the hypohalite ion is to be generated by mixing two kinds of the materials for preparation, the first solution and the second solution, the first solution can contain halide ion and the second solution can contain hypohalite ion higher in oxidative power than the halide ion in the first solution. Examples of the hypohalite ion can include hypochlorite ion for bromide ion, and hypochlorite ion and hypobromite ion for iodide ion. Specifically, for example, in cases where a treatment liquid including hypobromite ion as the hypohalite ion in the treatment liquid of the present invention is produced, the first solution can be a liquid including bromide ion and the second solution can be a liquid including hypochlorite ion. The oxidation-reduction potential (0.89 V (at 25° C., pH 14, vs. standard hydrogen electrode)) of hypochlorite ion-chloride ion is higher than the oxidation-reduction potential (0.76 V (same as above)) of hypobromite ion-bromide ion, and thus the first solution and the second solution can be mixed to thereby oxidize bromide ion by hypochlorite ion, thereby generating hypobromite ion and thus producing a treatment liquid including the hypobromite ion.

(Method for Preparing First Solution)

The method for preparing the first solution in the present invention is not particularly limited. Specifically, the first solution can be obtained by adding at least one anion species selected from halate ion, halite ion and halide ion to a solvent such as water. Other additive(s) and/or the like can also be, if necessary, added to the first solution. In cases where hypohalite ion is generated by mixing two kinds of the materials for preparation, the first solution and the second solution, and in cases where bromide ion or iodide ion is included in the first solution, the ion is obtained by, for example, dissolving a salt or the like which generates the ion when dissolved, in the solution. One example is a metal salt such as sodium bromide or sodium iodide, an organic salt compound such as tetraalkylammonium bromide or tetraalkylammonium iodide, a halogen gas such as a bromine gas or an iodine gas, or a hydrogen halide such as hydrogen bromide or hydrogen iodide. In particular, an organic salt compound, a halogen gas, or a hydrogen halide is preferable because of not including any metal causing a reduction in yield in semiconductor production. An organic salt compound is further preferable as a raw material of bromide ion or iodide ion in consideration of industrial availability and ease of handling. Examples of such an organic salt compound which can be particularly suitably used include an organic salt including onium ion, such as tetramethylammonium bromide or iodide, tetraethylammonium bromide or iodide, or tetrapropylammonium bromide or iodide, from the viewpoint of stability, purity, and cost.

The organic salt for use in the present invention can be, for example, tetraalkylammonium bromide produced from tetraalkylammonium ion and bromide ion. The method for producing the tetraalkylammonium bromide can be a method only involving mixing an aqueous solution including tetraalkylammonium hydroxide, with an aqueous solution including bromide ion, or a bromine-containing gas which is dissolved in water to thereby generate bromide ion, for example, hydrogen bromide. Examples of the tetraalkylammonium hydroxide for use in production of the tetraalkylammonium bromide include tetramethylammonium hydroxide, tetraethylammonium hydroxide, tetrapropylammonium hydroxide, or tetrabutylammonium hydroxide. In particular, tetramethylammonium hydroxide is more preferable because the number of hydroxide ions per unit weight is large and a high-quality article is easily available. Examples of a bromine ion source which generates bromide ion for use in production of the tetraalkylammonium bromide include hydrogen bromide, lithium bromide, sodium bromide, potassium bromide, rubidium bromide, cesium bromide, or ammonium bromide. In particular, hydrogen bromide is suitable because it does not substantially include any metal, it is industrially available, and a high-quality article is easily available. While bromide is exemplified as the organic salt in the above description, iodide can also be used in the same manner.

The concentration of at least one anion species selected from halate ion, halite ion and halide ion contained in the first solution can be appropriately set so as to be a desired concentration in the treatment liquid of the present invention which is obtained by mixing with the second solution. For example, in cases where no hypohalite ion is generated by mixing the first solution and the second solution, the concentration of the anion species contained in the first solution can be set in consideration of the volume of the treatment liquid after the mixing. On the other hand, in cases where hypohalite ion is generated by mixing the first solution and the second solution, the concentration of the halide ion contained in the first solution can be set in consideration of the amount of halide ion which is consumed by generation of the hypohalite ion.

For example, at least one of the anion species selected from halate ion, halite ion and halide ion in the first solution has a concentration of usually 0.4 mol/L or more, preferably 0.7 mol/L or more, more preferably 1.5 mol/L or more, and usually 6.0 mol/L or less, preferably 2.5 mol/L or less, more preferably 1.5 mol/L or less, from the viewpoint of effective inhibition of metal surface roughness.

The above-mentioned range can also be applied to the total concentration of the anion species in the first solution.

The first solution can include any component other than hypohalite ion, and can include, for example, any solvent and other additives described above.

The pH of the first solution is not particularly limited, and is preferably appropriately set so as to be a desired pH in, for example, the treatment liquid of the present invention which is obtained by mixing with the second solution. The pH is desirably 7 or more and 14 or less, more preferably 8 or more and 14 or less, from the viewpoint that the change in pH after the mixing is inhibited. The solution, which has a pH in the range, can allow a reduction in pH occurring in mixing with a second solution described below, to be decreased, and can allow a treatment liquid finally obtained, to be stably produced, stored, and used. In cases where the pH of the first solution is less than 8, the pH and the amount of liquid of the first solution can be adjusted so that, in the case of mixing with the second solution, the pH of the treatment liquid after the mixing corresponds to alkaline. Other components included in the first solution, here used, are preferably any solvent, other additives, and pH adjuster described above with respect to the treatment liquid of the present invention.

(Method for Preparing Second Solution)

The method for preparing the second solution in the present invention is not particularly limited. Specifically, the second solution in the present invention can be obtained by adding hypohalite ion to a solvent such as water and further adding additive(s) if necessary added. The hypohalite ion here used can be, for example, sodium hypochlorite, sodium hypobromite, tetraalkylammonium hypochlorite, or tetraalkylammonium hypobromite. In particular, tetraalkylammonium hypochlorite or tetraalkylammonium hypobromite not including any metal causing a reduction in yield in a step of forming a semiconductor is preferably used. The tetraalkylammonium hypohalite can be prepared by a known method. For example, an aqueous solution including tetraalkylammonium hypochlorite can be prepared by preparing an aqueous tetraalkylammonium hydroxide solution and blowing chlorine thereinto. The solution including tetraalkylammonium hypochlorite can also be prepared by a method involving contacting a tetraalkylammonium hydroxide solution with a cation exchange type ion exchange resin, changing a cation in the ion exchange resin to tetraalkylammonium ion, and then exchanging sodium ion and the tetraalkylammonium ion under a stream of a sodium hypochlorite solution.

The concentration of the hypohalite ion contained in the second solution can be appropriately set so as to be a desired concentration in the treatment liquid of the present invention which is obtained by mixing with the first solution. For example, in cases where no hypohalite ion is generated by mixing the first solution and the second solution, the concentration of the hypohalite ion contained in the second solution can be set in consideration of the volume of the treatment liquid after the mixing. On the other hand, in cases where hypohalite ion is generated by mixing the first solution and the second solution, the concentration of the hypohalite ion contained in the second solution can be set in consideration of the amount of hypohalite ion which is consumed by generation of the hypohalite ion.

For example, the concentration of the hypohalite ion in the second solution is usually 0.05 mol/L or more, preferably 0.1 mol/L or more, more preferably 0.2 mol/L or more, and usually 3.5 mol/L or less, preferably 0.8 mol/L or less, more preferably 0.3 mol/L or less, further preferably 0.2 mol/L or less, from the viewpoint of effective inhibition of metal surface roughness.

The ratio (Amount of second solution used/Amount of first solution used) of the amount of the second solution used, to the amount of the first solution used, is not particularly limited, and it is usually 0.1 or more, preferably 0.15 or more, more preferably 0.25 or more, and usually 10 or less, preferably 6 or less, more preferably 4 or less on a weight ratio, from the viewpoint of effective inhibition of metal surface roughness.

The ratio (Concentration of anion species/Concentration of hypohalite ion) of the concentration (mol/L) (which can be the total concentration of the anion species in the first solution.) of the at least one anion species in the first solution to the concentration (mol/L) of the hypohalite ion in the second solution is not particularly limited, and is usually 2 or more, preferably 4 or more, more preferably 6 or more, further preferably 8 or more, and usually 500 or less, preferably 200 or less, more preferably 50 or less, further preferably 10 or less, from the viewpoint of effective inhibition of metal surface roughness.

The second solution can include any component other than the anion species, and can include, for example, any solvent and other additives described above.

The pH of the second solution is not particularly limited, and is preferably appropriately set so as to be a desired pH in, for example, the treatment liquid of the present invention which is obtained by mixing with the first solution. The pH is desirably 7 or more and 14 or less, more preferably 10 or more and 14 or less, particularly preferably 12 or more and 14 or less, from the viewpoint that the change in pH after the mixing is inhibited. The solution, which has a pH in the range, can allow a reduction in pH occurring in mixing with the first solution, to be decreased, and can allow the treatment liquid of the present invention to be stably produced, stored, and used. Other components included in the second solution, here used, are preferably any solvent, other additives, and pH adjuster described above with respect to the treatment liquid of the present invention.

The oxidative power of the anion species included in the first solution and the oxidative power of the hypohalite ion included in the second solution are not particularly limited and can be appropriately set, and the oxidative power of the hypohalite ion is preferably higher than the oxidative power of the anion species, from the viewpoint of effective inhibition of metal surface roughness.

Production and storage of the treatment liquid of the present invention and the materials for preparation are preferably made at a low temperature under light-shielding without any amine included. Such production and storage can be made at a low temperature under light-shielding without any amine to thereby allow the effect of inhibiting the oxidizing agent and the anion species in the treatment liquid from being decomposed to be expected. Such production and storage of the treatment liquid of the present invention and the materials for preparation can be made in a container into which an inert gas is enclosed, to thereby allow incorporation of carbon dioxide to be prevented and thus allow stability of the treatment liquid to be maintained. An inner surface of the container, namely, a surface to be contacted with the treatment liquid, is preferably formed from glass or an organic polymer material. The reason for this is because, when the inner surface of the reaction container is formed from glass or an organic polymer material, incorporation of impurities such as a metal, a metal oxide, and an organic substance can be more reduced.

Onium ion is preferably included in at least one solution selected from the first solution and the second solution, in particular, preferably in both the first solution and the second solution, from the viewpoint of effective inhibition of metal surface roughness.

An aspect of the onium ion, here applied, can be the same aspect of the onium ion as described with respect to the treatment liquid of the present invention.

The concertation of the onium ion in at least one solution selected from the first solution and the second solution is not particularly limited, and is usually 0.00002 mol/L or more, preferably 0.002 mol/L or more, more preferably 0.02 mol/L or more, and usually 6.0 mol/L or less, preferably 4.0 mol/L or less, more preferably 2.0 mol/L or less, further preferably 1.0 mol/L or less, from the viewpoint of effective inhibition of metal surface roughness.

The total concentration of the onium ion included in the first solution and the second solution, with respect to the total amount of these solutions, is not particularly limited, and is usually 0.00001 mol/L or more, preferably 0.001 mol/L or more, more preferably 0.01 mol/L or more, and usually 6.0 mol/L or less, preferably 3.0 mol/L or less, more preferably 2.0 mol/L or less, further preferably 1.0 mol/L or less, from the viewpoint of effective inhibition of metal surface roughness.

(Compounding of Materials for Preparation)

The concentration of each component included in two kinds of the materials for preparation, the first solution and the second solution, in the method for producing the treatment liquid of the present invention, is not particularly limited, and can be prepared so that desired compounding is achieved in a treatment liquid obtained after mixing the materials for preparation.

Specifically, in cases where a treatment liquid is obtained which includes 0.001 mol/L or more and 2.0 mol/L or less of the hypochlorite ion, and 0.30 mol/L or more and 5.00 mol/L or less of chloride ion and 0.3 mol/L or more and 1.50 mol/L or less of chlorate ion, as the anion species, a semiconductor wafer treatment liquid can be obtained by preparing, as the first solution, a solution including 0.60 mol/L or more and 6.0 mol/L or less of chloride ion and 0.60 mol/L or more and 3.0 mol/L or less of chlorate ion, and, as the second solution, a solution including 0.002 mol/L or more and 4.0 mol/L or less of hypochlorite ion, and mixing such materials for preparation before a treatment of a semiconductor wafer.

Alternatively, in cases where a treatment liquid is obtained which includes 0.001 mol/L or more and 2.0 mol/L or less of hypochlorite ion and hypobromite ion, as the hypohalite ion, and 0.30 mol/L or more and 5.0 mol/L or less of chloride ion and 0.3 mol/L or more and 1.50 mol/L or less of chlorate ion, as the anion species, in the treatment liquid, a semiconductor wafer treatment liquid can be obtained by preparing, as the first solution, a solution including 0.60 mol/L or more and 6.0 mol/L or less of chloride ion, 0.002 mol/L or more and 0.40 mol/L or less of bromide ion, and 0.60 mol/L or more and 3.00 mol/L or less of chlorate ion, and, as the second solution, a solution including 0.002 or more and 4.0 mol/L or less of hypochlorite ion, and mixing such materials for preparation before a treatment of a semiconductor wafer.

(Method for Mixing Materials for Preparation)

The mixing method in the step of mixing the first solution and the second solution, here used, can be a method widely known as a method for mixing a semiconductor chemical solution. For example, a method using a mixing tank, a method involving mixing in pipes of a semiconductor production apparatus (in-line mixing), or a method involving mixing by simultaneous application of a plurality of liquids onto a wafer can be suitably used. In cases where hypohalite ion is generated by mixing the first solution and the second solution, the materials for preparation are preferably mixed in advance to thereby sufficiently generate hypohalite ion and then contacted with a semiconductor wafer, from the viewpoint of allowing the hypohalite ion to be certainly generated.

The temperature in mixing of the materials for preparation is not particularly limited as long as the treatment liquid is homogeneous after the mixing, and can be appropriately set usually within the range of 0° C. or more and 80° C. or less.

In cases where hypohalite ion is generated by mixing the materials for preparation, the mixing time is more preferably shorter because generation of the hypohalite ion is more favorably earlier. Examples of shortening of the mixing time include a method involving raising the temperature in the mixing, and, as the temperature is higher, decomposition of the hypohalite ion included in the second solution or the treatment liquid after the mixing tends to easily progress. For the reason, in cases where hypohalite ion is generated by mixing the materials for preparation, the temperature in mixing of the materials for preparation is more preferably 10° C. or more and 60° C. or less, most preferably 20° C. or more and 50° C. or less.

In cases where no hypohalite ion is generated by mixing the first solution and the second solution, the mixing can be performed until the temperature and the composition concentration of the treatment liquid after the mixing are homogeneous, and the mixing time of the materials for preparation can be appropriately set usually within 30 minutes. On the other hand, in cases where hypohalite ion is generated by mixing the first solution and the second solution, the mixing time is preferably long in order to certainly generate hypohalite ion and can be appropriately set usually within 60 minutes from the viewpoint of throughput, and the lower limit of the mixing time is not particularly needed to be set and is usually 5 minutes or more.

The production method can produce a semiconductor wafer treatment liquid, in particular, the semiconductor wafer treatment liquid of the present invention. A semiconductor wafer treatment liquid produced by the production method, or the above-mentioned treatment liquid of the present invention can be suitably used as a treatment liquid for an etch back process of a metal, in a semiconductor production process, in which not only an enhancement in wafer treatment efficiency per unit time, but also, for example, control of precise etching of a wiring material is required. Such a treatment liquid has the same effect also on a metal other than ruthenium, and thus can be used as an etching liquid of a metal included in a semiconductor wafer without any limitation on ruthenium.

Hereinafter, the method for using a semiconductor wafer treatment liquid produced by the production method, or the above-mentioned treatment liquid of the present invention (hereinafter, these are also collectively referred to as "the semiconductor wafer treatment liquid of the present invention") will be described.

A material for preparation according to another embodiment of the present invention is a material for preparation of a semiconductor wafer treatment liquid, the material including a first solution including at least one anion species selected from halate ion, halite ion and halide ion, and a second solution including hypohalite ion, and the above-mentioned conditions of the first solution and the second solution can be again applied to conditions of the first solution and the second solution.

The contents of the first solution and the second solution included in the material for preparation of the present invention are not particularly limited, and the material for preparation can be configured from only the first solution and the second solution.

The content of the first solution in the material for preparation is not particularly limited, and is usually 10 weight % or more, preferably 15 weight % or more, more preferably 20 weight % or more, and usually 90 weight % or less, preferably 60 weight % or less, more preferably 40 weight % or less, further preferably 30 weight % or less, from the viewpoint of effective inhibition of metal surface roughness.

The content of the second solution in the material for preparation is not particularly limited, and is usually 10 weight % or more, preferably 40 weight % or more, more preferably 60 weight % or more, further preferably 70 weight % or more, and usually 90 weight % or less, preferably 85 weight % or less, more preferably 80 weight % or less, from the viewpoint of effective inhibition of metal surface roughness.

(Kit)

A kit according to another embodiment of the present invention (also simply referred to as "kit") is a kit for preparing a semiconductor wafer treatment liquid, the kit (kit for semiconductor wafer treatment liquid production) including at least a first solution including at least one anion species selected from halate ion, halite ion and halide ion, and a second solution including hypohalite ion. Such first solution and second solution here used can be the abovementioned first solution and second solution.

An aspect of the kit is not particularly limited, and can be, for example, an aspect of a kit including a container receiving (or storing or retaining) the first solution, and a container receiving (or storing or retaining) the second solution, or an aspect of a container including two or more solution-receiving spaces, in which the first solution and the second solution are respectively received in two of the two or more solution-receiving spaces. The first solution and the second solution can be stored, conveyed, and used, with being received in the container. The solutions accommodated in such a kit can be mixed to thereby prepare a semiconductor wafer treatment liquid.

In the case of use of the aspect of the kit including the container receiving the first solution and the container receiving the second solution, an aspect of each of the containers is not particularly limited, the volume of each of the containers can be appropriately designed depending on the amount of the solution accommodated, and can be, for example, 20000 cm³ or more and 200000 cm³ or less, or 4000 cm³ or more and 20000 cm³ or less, and the material of each of the containers is preferably a material which hardly reacts with the solution contained and which less elutes impurities. The amount of the solution received in each of the containers can be appropriately designed depending on the amount of a treatment liquid to be finally obtained. The containers here used can be each, for example, made of PP (polypropylene), PE (polyethylene), PTFE, or PFA, or can be each made of any other than these materials, for example, a container made of a metal or glass, in which the inner wall is coated with any of these materials.

Also in the aspect of the container including two or more solution-receiving spaces, in which the first solution and the second solution are respectively received in two of the two or more solution-receiving spaces, the above-mentioned volume and material can be again applied to the volumes of two of the two or more solution-receiving spaces, and the material of the container.

The kit can be a kit including only the first solution and the second solution, or may be a kit including three or more liquids, the kit further including any solution other than the solutions, and is preferably a kit including only the first solution and the second solution from the viewpoint of simplification of a production process of the treatment liquid.

The method for producing the kit is not particularly limited, and the kit can be produced by a known method, depending on each of the aspects.

(Use of Semiconductor Wafer Treatment Liquid)

As described above, the semiconductor wafer treatment liquid of the present invention can be suitably used as a treatment liquid for an etch back process of a metal, in a semiconductor production process, in which not only an enhancement in wafer treatment efficiency per unit time, but also, for example, control of precise etching of a wiring material is required. The treatment liquid has the same effect also on a metal other than ruthenium, and thus can be used as an etching liquid of a metal included in a semiconductor wafer without any limitation on ruthenium.

Specific examples of a metal included in a semiconductor wafer to which the treatment liquid of the present invention is to be applied include Ru, Rh, Ti, Ta, Co, Cr, Hf, Os, Pt, Ni, Mn, Cu, Zr, La, Mo, or W, and at least one metal selected therefrom is included. The treatment liquid can be applied even when the metal is metal species singly or an alloy of a plurality of metal species. Among these metals, the treatment liquid can be suitably used for a metal such as Ru, Rh, Co, Cu, Mo, or W, useful in a wiring layer. In particular, Ru, Co, Mo, or W is preferable. The metal can be formed into a film by any method, and a method widely known with respect to a semiconductor production process, for example, CVD, ALD, PVD, sputtering, or plating can be used.

The metal can be, for example, an intermetallic compound, an ionic compound, or a complex. The metal can be exposed on a wafer surface, or can be covered with, for example, other metal, a metal oxide film, an insulating film, or a resist. Even in cases where the metal is covered with other material, both sufficient etching rate and surface roughness can be satisfied when the metal is contacted with the treatment liquid of the present invention and thus dissolved.

For example, in cases where the treatment liquid of the present invention is used in the step of forming metal wiring, the following is performed. First, a substrate made of a semiconductor (for example, Si) is prepared. The substrate prepared is subjected to an oxidation treatment, to thereby form a silicon oxide film on the substrate. Thereafter, an interlayer insulating film made of a low-dielectric constant (Low-k) film is formed, and via holes are here formed at a predetermined interval. After formation of the via holes, a metal is embedded into the via holes by thermal CVD, and furthermore a metal film is formed. The metal film is treated with the treatment liquid of the present invention, to thereby enable planarization to be made with a sufficient etching rate being kept.

The method for contacting the treatment liquid of the present invention with the semiconductor wafer on which the metal layer is formed is not particularly limited. For example, the treatment liquid of the present invention can be allowed to flow onto the semiconductor wafer with the wafer being rotated, or the semiconductor wafer can be immersed in a container filled with the treatment liquid of the present invention, and then contacted therewith.

The temperature in etching of a metal with the treatment liquid of the present invention is not particularly limited, and can be appropriately determined in consideration of, for example, the etching rate of a metal and stability of the treatment liquid. Since stability of the treatment liquid tends to be deteriorated as the temperature is higher, the treatment temperature is preferably lower. In this regard, the etching rate of a metal tends to be increased as the temperature is higher. The temperature in etching of a metal is preferably 10° C. or more and 90° C. or less, more preferably 15° C. or more and 70° C. or less, most preferably 20° C. or more and 60° C. or less, from the viewpoint that both stability of the treatment liquid and the etching rate are satisfied.

The treatment time in etching of a metal with the treatment liquid of the present invention is within the range of 0.1 minutes or more and 120 minutes or less, preferably 0.3 minutes or more and 60 minutes or less, and can be appropriately selected depending on etching conditions and a semiconductor element to be used. After the treatment liquid of the present invention is used, the treatment liquid can be removed by washing a semiconductor wafer surface contacted with the treatment liquid, with a rinsing liquid or the like. The rinsing liquid after use of the treatment liquid of the present invention is not particularly limited, and an organic solvent such as an alcohol, or deionized water can be used therefor. The semiconductor wafer after the rinsing can be subjected to, if necessary, drying of the surface of the wafer, and then the next step such as lamination of other wiring material.

EXAMPLES

Hereinafter, the present invention will be more specifically described with reference to Examples, but the present invention is not limited to these Examples. Herein, tetramethylammonium hypochlorite and tetramethylammonium chlorate used in Examples and Comparative Examples, and a semiconductor wafer for evaluation were prepared according to the following methods. In the following Examples and Comparative Examples, concentrations of metals and metal ions were 0.01 ppt to 1 ppb as measured by an inductively coupled plasma mass spectrometer (ICP-MS, Agilent 8900, manufactured by Agilent Technologies). Specifically, for example, in the Example 1, Li was 0.01 ppt, Na was 8 ppt, Mg was 1 ppt, Al was 50 ppt, K was 2 ppt, Ca was 10 ppt, Cr was 8 ppt, Mn was 0.5 ppt, Fe was 11 ppt, Co was 3 ppt, Ni was 2 ppt, Cu was 0.2 ppt, Zn was 11 ppt, Ag was 0.01 ppt, Cd was 0.5 ppt, Ba was 2 ppt, and Pb was 10 ppt.

(Preparation of Semiconductor Wafer for Evaluation of Etching Performance of Metal)

A ruthenium film, a molybdenum film, and a tungsten film, used in Examples and Comparative Examples, were formed as follows. A ruthenium film or a molybdenum film was obtained by forming an oxide film on a silicon wafer by use of a batch type thermal oxidation furnace, and forming a ruthenium film of 1200 Å or a molybdenum film of 1000 Å thereon by use of a sputtering method. A tungsten film was obtained by forming a thermal oxide film in the same manner and forming a tungsten film of 8000 Å thereon by a CVD method. The sheet resistance was measured using a four-probe resistance measuring instrument (Loresta-GP, manufactured by Mitsubishi Chemical Analytech Co., Ltd.), and the resulting value was converted to the film thickness and defined as the metal film thickness before an etching treatment.

(Preparation of Tetramethylammonium Hypochlorite (($CH_3$)$_4$NClO))

In a 2 L three-neck flask made of glass (manufactured by Cosmos Vid) were mixed 583.4 g of an aqueous 25 weight % tetramethylammonium hydroxide solution and 363.4 g of ion exchanged water, to obtain an aqueous 15.4 weight % tetramethylammonium hydroxide solution. The pH was here 14.2.

Next, a rotor (total length 30 mm×diameter 8 mm, manufactured by AS ONE Corporation) was placed in the three-neck flask, a thermometer protection tube (bottom-sealed type, manufactured by Cosmos Vid) and a thermometer were loaded into one opening, the tip of a PFA tube (F-8011-02, manufactured by FRON INDUSTRY) connected to a chlorine gas cylinder and a nitrogen gas cylinder and configured so that switching of chlorine gas/nitrogen gas could be arbitrarily made was immersed at the bottom in the solution through another opening, and the remaining one opening was connected to a gas-washing bottle (gas-washing bottle, model number 2450/500, manufactured by AS ONE Corporation) filled with an aqueous 5 weight % sodium hydroxide solution. A nitrogen gas was allowed to flow at 200 ccm (25° C.) from the PFA tube for 20 minutes, to thereby push out carbon dioxide of a gas phase portion.

Thereafter, a magnet stirrer (C-MAG HS10, manufactured by AS ONE Corporation) was installed at the lower portion of the three-neck flask, and a chlorine gas (specification purity 99.4%, manufactured by Fujiox Co., Ltd.) was fed at 200 ccm (25° C.) for 180 minutes under rotation at 300 rpm with the outer peripheral portion of the three-neck flask being cooled by ice water, to thereby obtain a 0.75 mol/L tetramethylammonium hypochlorite solution (including 0.75 mol/L tetramethylammonium chloride and 0.1 mol/L tetramethylammonium hydroxide). The liquid temperature in the reaction was here 11° C.

(Preparation of Tetramethylammonium Chlorate (($CH_3$)$_4$NClO$_3$))

A saturated solution obtained by adding sodium chlorate (manufactured by FUJIFILM Wako Pure Chemical Corporation) to ion exchanged water was stored in a refrigerator for 24 hours, and sodium chlorate precipitated was recovered by filtration. Sodium chlorate recovered was diluted with ultrapure water, and analyzed using an ion chromatography analyzer. It was confirmed by analyzing $CO_3^-$, $SO_4^-$, and $Cl^-$ in a dilution liquid that $Na_2CO_3$, $Na_2SO_4$, and NaCl included as impurities were decreased. It was confirmed by repeating such purification operations that the concentrations of $CO_3^-$, $SO_4^-$, and $Cl^-$ were each 500 ppb or less, and thus sodium chlorate purified was obtained.

Next, 200 mL of a strongly acidic ion exchange resin (Amberlite IR-120BNa, manufactured by ORGANO CORPORATION) was loaded to a glass column having an inner diameter of about 45 mm (Bio Column CF-50TK, manufactured by AS ONE Corporation). Thereafter, 1 L of normal hydrochloric acid (for volumetric analysis, manufactured by FUJIFILM Wako Pure Chemical Corporation) was allowed to flow through the ion exchange resin column for the purpose of exchange to a hydrogen type, and 1 L of ultrapure water was allowed to flow for the purpose of washing of the ion exchange resin with water. Furthermore, 2 L of a 2.38% tetramethylammonium hydroxide solution was allowed to flow through the ion exchange resin exchanged to a hydrogen type, and ion exchange from a hydrogen type to a tetramethylammonium type was performed. After such ion exchange, 1 L of ultrapure water was allowed to flow for the purpose of washing of the ion exchange resin with water.

After 6.4 g of sodium chlorate purified was placed in a fluororesin container, 93.6 g of ultrapure water was added to prepare an aqueous 6.4 weight % sodium chlorate solution. The aqueous sodium chlorate solution prepared was allowed to flow through the ion exchange resin exchanged to a tetramethylammonium type. The tetramethylammonium chlorate recovered was subjected to analysis of the Na concentration with a high-frequency inductively coupled plasma atomic emission spectroscopy (iCAP6500DuO, manufactured by Thermo Fisher Scientific K.K.), and it was confirmed that ion exchange was sufficiently performed. In the case of insufficient ion exchange, the operations were repeated to thereby obtain a 10 weight % tetramethylammonium chlorate solution where the Na concentration was 500 ppb or less. The solution obtained was heat-treated, to obtain a tetramethylammonium chlorate powder.

(Other Reagents)

Reagents other than the above, used in Examples and Comparative Examples, are as follows.

Tetramethylammonium chloride (($CH_3)_4NCl$): manufactured by Tokyo Chemical Industry Co., Ltd.

Tetramethylammonium bromide (($CH_3)_4NBr$): manufactured by Tokyo Chemical Industry Co., Ltd.

Sodium hypochlorite pentahydrate ($NaClO.5H_2O$): manufactured by Wako Pure Chemical Corporation Sodium chloride (NaCl): manufactured by FUJIFILM Wako Pure Chemical Corporation Sodium bromide (NaBr): manufactured by FUJIFILM Wako Pure Chemical Corporation Tetrapropylammonium chloride (($C_3H_7)_4NCl$): manufactured by Tokyo Chemical Industry Co., Ltd.

1,1-Dimethylpiperidinium chloride ($C_7H_{16}NCl$): manufactured by Tokyo Chemical Industry Co., Ltd.

Hexamethonium chloride dihydrate ($C_{12}H_{30}N_2Cl_2.2H_2O$): manufactured by Tokyo Chemical Industry Co., Ltd.

15 weight % HCl: manufactured by KANTO CHEMICAL CO., INC., (prepared by diluting 35 weight % HCl with ultrapure water)

1 mol/L NaOH: manufactured by FUJIFILM Wako Pure Chemical Corporation

Examples 1 to 38 and Comparative Examples 1 to 27

(Production of Semiconductor Wafer Treatment Liquid)

The aqueous 0.75 mol/L tetramethylammonium hypochlorite solution and the tetramethylammonium chlorate powder, obtained in Production Example described above, and tetramethylammonium chloride, tetramethylammonium bromide, ultrapure water, 15 weight % HCl, and 1 mol/L NaOH were mixed to thereby obtain 100 mL of each treatment liquid whose composition was described as in Tables 1 to 3. Herein, sodium hypochlorite pentahydrate was used instead of the aqueous 0.75 mol/L tetramethylammonium hypochlorite solution, sodium chloride was used instead of the tetramethylammonium chloride, and sodium bromide was used instead of the tetramethylammonium bromide, in Examples 16 and 34, and Comparative Examples 8 and 21. The concentration of the hypohalite ion, the concentration of the anion species, and the pH, of each of the semiconductor wafer treatment liquids obtained, were measured by the following methods. Each of the treatment liquids obtained was used to perform evaluation of etching performance of a metal and evaluation of the surface after etching, as shown below. The results are shown in Tables 1 to 3.

(Method for Measuring Respective Concentrations of Hypobromite Ion and Hypochlorite Ion)

The respective concentrations of the hypobromite ion and the hypochlorite ion were measured with an ultraviolet-visible spectrophotometer (UV-2600, manufactured by Shimadzu Corporation). Calibration curves were respectively created with aqueous solutions of hypobromite ion and hypochlorite ion, whose concentrations were known, and the respective concentrations of the hypobromite ion and the hypochlorite ion in each of the treatment liquids produced were determined.

(Method for Measuring Concentration of Anion Species)

The concentration of the anion species in each of the semiconductor wafer treatment liquids was analyzed using an ion chromatography analyzer (DIONEX INTEGRION HPLC, manufactured by Thermo Fisher Scientific K.K.). KOH was used as an eluent, and allowed to flow at a flow rate of 1.2 mL/min. An anion analysis column for a hydroxide-based eluent (AS15, manufactured by Thermo Fisher Scientific K.K.) was used as the column, and the column temperature was 30° C. After removing the background noise by a suppressor, the concentration of the anion species in each of the treatment liquids was quantified by an electrical conductivity detector.

(Method for Measuring pH)

The pH was measured with respect to 10 mL of each of the treatment liquids prepared in Examples and Comparative Examples, by use of a tabletop pH meter (LAQUA F-73, manufactured by HORIBA, Ltd.). The measurement of the pH was performed after each of the treatment liquids was prepared and stabilized at 25° C.

(Evaluation of Etching Performance of Metal)

Sixty mL of each of the treatment liquids of Examples was prepared in a container made of a fluororesin and equipped with a lid (a 94.0 mL PFA container, manufactured by AS ONE Corporation). Each 10×20 mm semiconductor wafer piece for evaluation was immersed in each of the treatment liquids at 25° C. or 50° C. for 1 minute, the value obtained by dividing the amount of change in film thickness before and after such a treatment, by the time for immersion, was calculated as the etching rate, and evaluated according to the following criteria. In any case, Ratings A to C represent acceptable levels, and Rating D represents an unacceptable level.

(Ruthenium Film, Molybdenum Film)

A: >50 Å/min

B: 50 to 20 Å/min

C: 20 to 10 Å/min (acceptable level)

D: etching impossible (Tungsten Film)

A: >500 Å/min

B: 500 to 100 Å/min

C: 100 to 10 Å/min (acceptable level)

D: etching impossible (Evaluation of Surface After Etching)

The metal surface was observed with a field-emission-type scanning electron microscope (JSM-7800F Prime, manufactured by JEOL Ltd.) before and after etching, and the presence of surface roughness was confirmed, and evaluated according to the following criteria. Ratings A to D sequentially represent less surface roughness, and in any case, Ratings A to C represent acceptable levels and Rating D represents an unacceptable level.

A: no surface roughness observed

B: surface roughness slightly observed

C: roughness observed on entire surface, but shallow roughness

D: roughness observed on entire surface, and deep roughness

TABLE 1

| | Hypohalite ion [mol/l] | Anion species [mol/l] | | | Onium ion | | Treatment temperature | Metal | Etching | Surface |
|---|---|---|---|---|---|---|---|---|---|---|
| | ClO⁻ | Cl⁻ | ClO$_3^-$ | Br⁻ | [mol/l] | pH | [° C.] | etched | rate | smoothness |
| Example 1 | 0.15 | 0.35 | — | — | 0.50 | 9.5 | 25 | Ru | A | C |
| Example 2 | 0.15 | 1.00 | — | — | 1.15 | 9.5 | 25 | Ru | A | A |
| Example 3 | 0.15 | 6.00 | — | — | 6.15 | 9.5 | 25 | Ru | B | A |
| Example 4 | 0.15 | 0.20 | 0.35 | — | 0.70 | 9.5 | 25 | Ru | A | C |
| Example 5 | 0.15 | 0.20 | 1.00 | — | 1.35 | 9.5 | 25 | Ru | A | A |
| Example 6 | 0.15 | 0.35 | 0.35 | — | 0.85 | 9.5 | 25 | Ru | A | B |
| Example 7 | 0.0070 | 0.35 | — | — | 0.36 | 9.5 | 50 | Ru | C | C |
| Example 8 | 0.0070 | 1.00 | — | — | 1.01 | 9.5 | 50 | Ru | C | A |
| Example 9 | 0.0070 | 0.0070 | 1.00 | — | 1.02 | 9.5 | 50 | Ru | C | B |
| Example 10 | 0.70 | 0.70 | — | — | 1.40 | 9.5 | 25 | Ru | A | B |
| Example 11 | 0.15 | 0.35 | — | — | 0.50 | 8.0 | 25 | Ru | A | C |
| Example 12 | 0.15 | 0.35 | — | — | 0.50 | 11.0 | 25 | Ru | C | C |
| Example 13 | 0.15 | 1.00 | — | — | 1.15 | 9.5 | 25 | Mo | B | A |
| Example 14 | 0.15 | 1.00 | — | — | 1.15 | 9.5 | 25 | W | A | A |
| Example 15 | 0.15 | 1.00 | — | — | 1.15 | 9.5 | 25 | Cr | B | A |
| Example 16 | 0.15 | 0.35 | — | — | 0.0 | 9.5 | 25 | Ru | A | C |
| Comparative Example 1 | 0.15 | 0.25 | — | — | 0.40 | 9.5 | 25 | Ru | A | D |
| Comparative Example 2 | 0.15 | 0.25 | 0.10 | — | 0.50 | 9.5 | 25 | Ru | A | D |
| Comparative Example 3 | 0.0070 | 0.25 | — | — | 0.26 | 9.5 | 50 | Ru | C | D |
| Comparative Example 4 | 0.15 | 0.25 | — | — | 0.40 | 11.0 | 25 | Ru | C | D |
| Comparative Example 5 | 0.15 | 0.25 | — | — | 0.40 | 9.5 | 25 | Mo | B | D |
| Comparative Example 6 | 0.15 | 0.25 | — | — | 0.40 | 9.5 | 25 | W | A | D |
| Comparative Example 7 | 0.15 | 0.25 | — | — | 0.40 | 9.5 | 25 | Cr | B | D |
| Comparative Example 8 | 0.15 | 0.25 | — | — | 0.0 | 9.5 | 25 | Ru | A | D |
| Comparative Example 9 | 0.15 | 7.00 | — | — | 7.15 | 9.5 | 25 | Ru | C | D |
| Comparative Example 10 | 0.15 | 7.00 | — | — | 7.15 | 9.5 | 25 | Mo | C | D |
| Comparative Example 11 | 0.15 | 7.00 | — | — | 7.15 | 9.5 | 25 | W | C | D |
| Comparative Example 12 | 0.15 | 7.00 | — | — | 7.15 | 9.5 | 25 | Cr | C | D |

TABLE 2

| | Hypohalite ion [mol/l] | Anion species [mol/l] | | | Onium ion | | Treatment temperature | Metal | Etching | Surface |
|---|---|---|---|---|---|---|---|---|---|---|
| | BrO⁻ | Cl⁻ | ClO$_3^-$ | Br⁻ | [mol/l] | pH | [° C.] | etched | rate | smoothness |
| Example 17 | 0.050 | 0.35 | — | — | 0.40 | 12.5 | 25 | Ru | A | C |
| Example 18 | 0.050 | 1.00 | — | — | 1.05 | 12.5 | 25 | Ru | A | A |
| Example 19 | 0.050 | 6.00 | — | — | 6.05 | 12.5 | 25 | Ru | B | A |
| Example 20 | 0.050 | 0.20 | 0.35 | — | 0.60 | 12.5 | 25 | Ru | A | C |
| Example 21 | 0.050 | 0.20 | 1.00 | — | 1.25 | 12.5 | 25 | Ru | A | A |
| Example 22 | 0.050 | 0.20 | — | 0.35 | 0.60 | 12.5 | 25 | Ru | A | C |
| Example 23 | 0.050 | 0.20 | — | 1.00 | 1.25 | 12.5 | 25 | Ru | A | A |
| Example 24 | 0.050 | 0.35 | 0.35 | 0.35 | 1.10 | 12.5 | 25 | Ru | A | B |
| Example 25 | 0.0010 | 0.35 | — | — | 0.35 | 12.5 | 50 | Ru | C | C |
| Example 26 | 0.0010 | 1.00 | — | — | 0.35 | 12.5 | 50 | Ru | C | A |
| Example 27 | 0.0010 | 0.0010 | 1.00 | — | 0.35 | 12.5 | 50 | Ru | C | B |
| Example 28 | 0.20 | 0.35 | — | — | 0.55 | 12.5 | 25 | Ru | A | C |
| Example 29 | 0.050 | 0.35 | — | — | 0.40 | 11.0 | 25 | Ru | A | C |
| Example 30 | 0.050 | 0.35 | — | — | 0.40 | 13.5 | 25 | Ru | C | C |
| Example 31 | 0.050 | 1.00 | — | — | 1.05 | 12.5 | 25 | Mo | A | A |
| Example 32 | 0.050 | 1.00 | — | — | 1.05 | 12.5 | 25 | W | A | A |
| Example 33 | 0.050 | 1.00 | — | — | 1.05 | 12.5 | 25 | Cr | A | A |
| Example 34 | 0.050 | 0.35 | — | — | 0.0 | 12.5 | 25 | Ru | A | C |
| Comparative Example 13 | 0.050 | 0.25 | — | — | 0.30 | 12.5 | 25 | Ru | A | D |
| Comparative Example 14 | 0.050 | 0.10 | 0.25 | — | 0.40 | 12.5 | 25 | Ru | A | D |
| Comparative Example 15 | 0.050 | 0.10 | — | 0.25 | 0.40 | 12.5 | 25 | Ru | A | D |

TABLE 2-continued

|  | Hypohalite ion [mol/l] BrO⁻ | Anion species [mol/l] Cl⁻ | ClO₃⁻ | Br⁻ | Onium ion [mol/l] | pH | Treatment temperature [° C.] | Metal etched | Etching rate | Surface smoothness |
|---|---|---|---|---|---|---|---|---|---|---|
| Comparative Example 16 | 0.0010 | 0.25 | — | — | 0.25 | 12.5 | 50 | Ru | C | D |
| Comparative Example 17 | 0.050 | 0.25 | — | — | 0.30 | 13.5 | 25 | Ru | C | D |
| Comparative Example 18 | 0.050 | 0.25 | — | — | 0.30 | 12.5 | 25 | Mo | A | D |
| Comparative Example 19 | 0.050 | 0.25 | — | — | 0.30 | 12.5 | 25 | W | A | D |
| Comparative Example 20 | 0.050 | 0.25 | — | — | 0.30 | 12.5 | 25 | Cr | A | D |
| Comparative Example 21 | 0.050 | 0.25 | — | — | 0.0 | 12.5 | 25 | Ru | A | D |
| Comparative Example 22 | 0.050 | 7.00 | — | — | 7.05 | 12.5 | 25 | Ru | C | D |
| Comparative Example 23 | 0.050 | 7.00 | — | — | 7.05 | 12.5 | 25 | Mo | C | D |
| Comparative Example 24 | 0.050 | 7.00 | — | — | 7.05 | 12.5 | 25 | W | C | D |
| Comparative Example 25 | 0.050 | 7.00 | — | — | 7.05 | 12.5 | 25 | Cr | C | D |

TABLE 3

|  | Hypohalite ion [mol/l] | | Anion species [mol/l] | | | Onium ion [mol/l] | pH | Treatment Temperature [° C.] | Metal etched | Etching rate | Surface smoothness |
|---|---|---|---|---|---|---|---|---|---|---|---|
|  | ClO⁻ | BrO⁻ | Cl⁻ | ClO₃⁻ | Br⁻ | | | | | | |
| Example 35 | 0.15 | 0.050 | 0.35 | 0.35 | — | 0.90 | 12.5 | 25 | Ru | A | B |
| Example 36 | 0.15 | 0.050 | 0.70 | — | — | 0.90 | 12.5 | 25 | Ru | A | B |
| Example 37 | 0.050 | 0.15 | 0.35 | — | — | 0.55 | 12.5 | 25 | Ru | A | C |
| Example 38 | 0.15 | 0.050 | 0.35 | — | — | 0.0 | 12.5 | 25 | Ru | A | C |
| Comparative Example 26 | 0.15 | 0.050 | 0.25 | — | — | 0.45 | 12.5 | 25 | Ru | A | D |
| Comparative Example 27 | 0.15 | 0.050 | 0.25 | — | — | 0.0 | 12.5 | 25 | Ru | A | D |

Examples 39 to 41 and Comparative Example 28

First and second solutions (materials for preparation) whose compositions were as described in Table 4 were prepared, and the respective solutions were each separately stored in a pure bottle (volume 20 L, inner wall of PE, light-shielding, manufactured by KODAMA PLASTICS Co., Ltd.) sealed and purged with $N_2$, at 25° C. The solutions stored in such respective containers were mixed at a mixing ratio (volume ratio) described in Table 4, to thereby obtain each treatment liquid whose composition was described in Table 5. The etching rate and metal surface smoothness were evaluated in the same manner as in Example 1. The results are shown in Table 5.

TABLE 4

|  | First solution (material for preparation) | | | | Second solution (material for preparation) | | Mixing ratio (first solution:second solution) |
|---|---|---|---|---|---|---|---|
|  | Anion species (mol/L) | | | pH | Hypohalite ion (mol/L) | pH | |
| Example 39 | $(CH_3)_4NCl$ (0.40) | — | — | 12.5 | $(CH_3)_4NClO$ (0.30) | 12.5 | 1:1 |
| Example 40 | $(CH_3)_4NCl$ (0.50) | $(CH_3)_4NBr$ (0.80) | — | 12.5 | $(CH_3)_4NClO$ (0.10) | 12.5 | 1:1 |
| Example 41 | $(CH_3)_4NCl$ (0.20) | $(CH_3)_4NBr$ (0.10) | $(CH_3)_4NClO_3$ (0.70) | 12.5 | $(CH_3)_4NClO$ (0.40) | 12.5 | 1:1 |
| Comparative Example 28 | — | $(CH_3)_4NBr$ (0.10) | — | 12.5 | $(CH_3)_4NClO$ (0.40) | 12.5 | 1:1 |

TABLE 5

|  | Hypohalite ion [mol/l] | | Anion species [mol/l] | | | Onium ion [mol/l] | pH | Treatment temperature [° C.] | Metal etched | Etching rate | Surface smoothness |
| --- | --- | --- | --- | --- | --- | --- | --- | --- | --- | --- | --- |
|  | ClO⁻ | BrO⁻ | Cl⁻ | ClO₃⁻ | Br⁻ | | | | | | |
| Example 39 | 0.15 | — | 0.35 | — | — | 0.50 | 12.5 | 25 | Ru | A | C |
| Example 40 | — | 0.050 | 0.35 | — | 0.35 | 0.75 | 12.5 | 25 | Ru | A | B |
| Example 41 | 0.15 | 0.050 | 0.35 | 0.35 | — | 0.90 | 12.5 | 25 | Ru | A | B |
| Comparative Example 28 | 0.15 | 0.050 | 0.25 | — | — | 0.45 | 12.5 | 25 | Ru | A | D |

Example 42

The treatment liquid of Example 35 and the treatment liquid of Example 41 (first and second solutions (materials for preparation)) were prepared, the day on which the liquids were prepared was defined as day 1, and the storage test for 150 days was performed in the same manner as in Example 1 (storage conditions: nitrogen sealing, under light-shielding, at 25° C.). The treatment liquid of Example 41 was stored in the form of first and second solutions, and the solutions were mixed to prepare the treatment liquid immediately before evaluation. The results are shown in Table 6.

TABLE 6

| Time | Etching rate | | Surface smoothness | |
| --- | --- | --- | --- | --- |
| [day] | Example 35 | Example 41 | Example 35 | Example 41 |
| 1 | A | A | B | B |
| 10 | A | A | B | B |
| 30 | B | A | C | B |
| 60 | C | A | C | B |
| 150 | D | A | D | B |

Examples 43 to 56

Each treatment liquid whose composition was described in Table 7 was obtained. The etching rate and metal surface smoothness were evaluated in the same manner as in Example 1. The results are shown in Table 7.

TABLE 7

|  | Hypohalite ion [mol/l] | | Anion species [mol/l] | Onium ion added [mol/l] | Onium ion [mol/l] | pH | Treatment temperature [° C.] | Metal etched | Etching rate | Surface smoothness |
| --- | --- | --- | --- | --- | --- | --- | --- | --- | --- | --- |
|  | ClO⁻ | BrO⁻ | Cl⁻ | | | | | | | |
| Example 43 | 0.15 | 0.050 | 0.35 | — | 0.55 | 12.5 | 25 | Ru | A | C |
| Example 44 | 0.15 | 0.050 | 0.35 | Tetrapropylammonium ion (0.0010) | 0.551 | 12.5 | 25 | Ru | A | B |
| Example 45 | 0.15 | 0.050 | 0.35 | Tetrapropylammonium ion (0.010) | 0.56 | 12.5 | 25 | Ru | A | B |
| Example 46 | 0.15 | 0.050 | 1.25 | Tetrapropylammonium ion (1.00) | 1.55 | 12.5 | 25 | Ru | A | A |
| Example 47 | 0.15 | 0.050 | 2.25 | Tetrapropylammonium ion (2.00) | 2.55 | 12.5 | 25 | Ru | A | A |
| Example 48 | 0.15 | 0.050 | 0.35 | Decyltrimethylammonium ion (0.0005) | 0.55 | 12.5 | 25 | Ru | A | A |
| Example 49 | 0.15 | 0.005 | 0.35 | Decyltrimethylammonium ion (0.0005) | 0.55 | 10.5 | 25 | Ru | A | A |
| Example 50 | 0.15 | 0.050 | 0.35 | Octadecyltrimethylammonium ion (0.00001) | 0.55 | 12.5 | 25 | Ru | B | A |
| Example 51 | 0.15 | 0.050 | 0.35 | Octadecyltrimethylammonium ion (0.1) | 0.65 | 12.5 | 25 | Ru | B | A |
| Example 52 | 0.15 | 0.005 | 0.35 | Octadecyltrimethylammonium ion (0.1) | 0.65 | 10.5 | 25 | Ru | B | A |
| Example 53 | 0.15 | 0.050 | 0.35 | 1,1-Dimethylpiperidinium ion (0.10) | 0.65 | 12.5 | 25 | Ru | A | B |
| Example 54 | 0.15 | 0.050 | 0.35 | Hexamethonium ion (0.10) | 0.65 | 12.5 | 25 | Ru | A | B |
| Example 55 | 0.15 | 0.050 | 1.25 | Tetrapropylammonium ion (1.00) | 1.55 | 8.0 | 25 | Ru | A | A |
| Example 56 | 0.15 | 0.050 | 1.25 | Tetrapropylammonium ion (1.00) | 1.55 | 13.5 | 25 | Ru | B | A |

Examples 57

The treatment liquid of Comparative Example 13 and the treatment liquid of Example 21 were prepared, and the day on which the liquids were prepared was defined as day 1, and the storage test for 150 days was performed in the same manner as in Example 1 (storage conditions: nitrogen sealing, under light-shielding, at 25° C.). The results are shown in Table 8.

TABLE 8

| Time [day] | Etching rate | | Surface smoothness | |
|---|---|---|---|---|
| | Comparative Example 13 | Example 21 | Comparative Example 13 | Example 21 |
| 1 | A | A | D | A |
| 10 | B | A | D | A |
| 30 | C | B | D | B |
| 60 | D | B | D | B |
| 150 | D | C | D | C |

Examples 58

The treatment liquid of Comparative Example 1 and the treatment liquid of Example 2 were prepared, and the day on which the liquids were prepared was defined as day 1, and the storage test for 150 days was performed in the same manner as in Example 1 (storage conditions: nitrogen sealing, under light-shielding, at 25° C.). The results are shown in Table 9.

TABLE 9

| Time [day] | Etching rate | | Surface smoothness | |
|---|---|---|---|---|
| | Comparative Example 1 | Example 2 | Comparative Example 1 | Example 2 |
| 1 | A | A | D | A |
| 10 | B | A | D | A |
| 30 | B | A | D | B |
| 60 | C | B | D | B |
| 150 | D | B | D | B |

As shown in Table 1, the surface after etching was rough and both the etching rate and smoothness could not be satisfied in cases where each of the treatment liquids shown in Comparative Examples 1 to 28 was used. In this regard, as shown in Tables 1 to 3, surface smoothness after etching was favorable and thus both the etching rate and smoothness could be satisfied in each of the treatment liquids shown in Examples 1 to 38 according to Inventive Examples. As shown in Tables 4 and 5, both the etching rate and smoothness could be satisfied in Examples 39 to 41 in which the first solution including the anion species and the second solution including the oxidizing agent were prepared and both the solutions were mixed to prepare the treatment liquid before etching of each semiconductor wafer for evaluation. As shown in Table 6, the respective treatment liquids (Examples 35 and 41) of one-liquid and two-liquid types (kits) were compared in terms of performance in Example 42, and the two-liquid type (kit) obtained by producing the treatment liquid immediately before a treatment of a metal exhibited more excellent etching rate and surface smoothness over a long period than the one-liquid type (kit). As shown in Table 7, characteristics of each of the treatment liquids, into which not only the anion species, but also the onium ion was added, were evaluated in Examples 43 to 56, and the onium ion was added to thereby more improve surface smoothness with the etching rate being kept. As shown in Tables 8 and 9, it has been found that the treatment liquid according to the embodiment of the present invention containing more anionic species has more excellent stability to etching rate and surface smoothness.

The invention claimed is:

1. A semiconductor wafer treatment liquid, the treatment liquid comprising:
   at least one hypohalite ion; and
   at least one anion species selected from halate ion, halite ion and halide ion;
   wherein the halate ion is at least one selected from $ClO_3$, $BrO_3$, and $IO_3$; the halite ion is at least one selected from $ClO_2$, $BrO_2$, and $IO_2$; the halide ion is at least one selected from Cl—, Br, and I—;
   the treatment liquid has a pH of 7 or more and 14 or less; and
   at least one of the anion species has a content of 0.30 mol/L or more and 6.00 mol/L or less relative to the treatment liquid,
   wherein the at least one hypohalite ion comprises hypobromite ion, wherein the hypobromite ion has a content of 0.0010 mol/L or more and 0.20 mol/L or less relative to the treatment liquid.

2. The semiconductor wafer treatment liquid according to claim 1, comprising two or more anion species, as the anion species.

3. The semiconductor wafer treatment liquid according to claim 1, comprising at least halide ion as the anion species having a content of 0.30 mol/L or more and 6.00 mol/L or less relative to the treatment liquid.

4. The semiconductor wafer treatment liquid according to claim 1, wherein the hypohalite ion has a content of 0.0010 mol/L or more and 4.00 mol/L or less relative to the treatment liquid.

5. The semiconductor wafer treatment liquid according to claim 1, comprising at least one of ion species selected from hypochlorite ion and hypobromite ion, as the hypohalite ion.

6. The semiconductor wafer treatment liquid according to claim 5, comprising hypochlorite ion and hypobromite ion, as the hypohalite ion.

7. The semiconductor wafer treatment liquid according to claim 1, wherein the treatment liquid further comprises onium ion.

8. The semiconductor wafer treatment liquid according to claim 1, wherein the semiconductor wafer comprises at least one metal selected from Ru, Rh, Ti, Ta, Co, Cr, Hf, Os, Pt, Ni, Mn, Cu, Zr, La, Mo, and W.

9. A method for producing a semiconductor wafer treatment liquid, the method comprising:
   preparing a first solution comprising at least one of anion species selected from halate ion, halite ion and halide ion;
   preparing a second solution comprising hypohalite ion; and
   mixing the first solution and the second solution;
   wherein the semiconductor wafer treatment liquid comprising:
   at least one hypohalite ion; and
   at least one anion species selected from halate ion, halite ion and halide ion;
   wherein the halate ion is at least one selected from $ClO_3$, $BrO_3$, and $IO_3$; the halite ion is at least one selected from $ClO_2$, $BrO_2$, and $IO_2$; the halide ion is at least one selected from Cl—, Br, and I—;

the treatment liquid has a pH of 7 or more and 14 or less; and at least one of the anion species has a content of 0.30 mol/L or more and 6.00 mol/L or less relative to the treatment liquid, wherein the at least one hypohalite ion comprises hypobromite ion, wherein the hypobromite ion has a content of 0.0010 mol/L or more and 0.20 mol/L or less relative to the treatment liquid.

10. The method for producing a semiconductor wafer treatment liquid according to claim 9, wherein an oxidative power of the hypohalite ion comprised in the second solution is higher than an oxidative power of the anion species comprised in the first solution.

11. The method for producing a semiconductor wafer treatment liquid according to claim 9, wherein at least one of the anion species comprised in the first solution is bromide ion, and the hypohalite ion comprised in the second solution is hypochlorite ion.

12. The method for producing a semiconductor wafer treatment liquid according to claim 9, wherein at least one solution selected from the first solution and the second solution comprises onium ion.

13. The method for producing a semiconductor wafer treatment liquid according to claim 12, wherein the first solution and the second solution each comprise onium ion.

* * * * *

UNITED STATES PATENT AND TRADEMARK OFFICE
CERTIFICATE OF CORRECTION

PATENT NO. : 12,247,298 B2
APPLICATION NO. : 17/642059
DATED : March 11, 2025
INVENTOR(S) : T. Sato et al.

It is certified that error appears in the above-identified patent and that said Letters Patent is hereby corrected as shown below:

In the Claims

Column 34, Lines 14-15 (Claim 1, Lines 6-7), please change "$ClO_3$, $BrO_3$, and $IO_3$;" to -- $ClO_3^-$, $BrO_3^-$, and $IO_3^-$; --.

Column 34, Line 16 (Claim 1, Line 8), please change "$ClO_2$, $BrO_2$, and $IO_2$;" to -- $ClO_2^-$, $BrO_2^-$, and $IO_2^-$; --.

Column 34, Line 17 (Claim 1, Line 9), please change "Cl—, Br, and I—;" to -- $Cl^-$, $Br^-$, and $I^-$; --.

Column 34, Lines 64-65 (Claim 9, Lines 14-15), please change "$ClO_3$, $BrO_3$, and $IO_3$;" to -- $ClO_3^-$, $BrO_3^-$, and $IO_3^-$; --.

Column 34, Line 66 (Claim 9, Line 16), please change "$ClO_2$, $BrO_2$, and $IO_2$;" to -- $ClO_2^-$, $BrO_2^-$, and $IO_2^-$; --.

Column 34, Line 67 (Claim 9, Line 17), please change "Cl—, Br, and I—;" to -- $Cl^-$, $Br^-$, and $I^-$; --.

Signed and Sealed this
Twenty-ninth Day of April, 2025

Coke Morgan Stewart
*Acting Director of the United States Patent and Trademark Office*